US011682727B2

(12) United States Patent
Masuoka et al.

(10) Patent No.: US 11,682,727 B2
(45) Date of Patent: Jun. 20, 2023

(54) SEMICONDUCTOR DEVICE HAVING SEMICONDUCTOR PILLAR WITH FIRST IMPURITY REGION FORMED LOWER PART OF THE PILLAR AND SECOND IMPURITY REGION FORMED UPPER PART OF THE PILLAR

(71) Applicant: Unisantis Electronics Singapore Pte. Ltd., Singapore (SG)

(72) Inventors: Fujio Masuoka, Tokyo (JP); Nozomu Harada, Tokyo (JP); Yoshiaki Kikuchi, Leuven (BE)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/102,819

(22) Filed: Nov. 24, 2020

(65) Prior Publication Data

US 2021/0104628 A1    Apr. 8, 2021

Related U.S. Application Data

(63) Continuation of application No. PCT/JP2018/020383, filed on May 28, 2018.

(51) Int. Cl.
*H01L 29/78* (2006.01)
*H01L 29/08* (2006.01)
(Continued)

(52) U.S. Cl.
CPC ...... *H01L 29/7827* (2013.01); *H01L 29/0847* (2013.01); *H01L 29/66666* (2013.01);
(Continued)

(58) Field of Classification Search
CPC ............. H01L 29/7827; H01L 29/0847; H01L 29/66666; H01L 29/7848; H01L 21/02238;
(Continued)

(56) References Cited

U.S. PATENT DOCUMENTS 9,275,911 B2 * 3/2016 Cheng ............. H01L 21/823878
9,530,866 B1 * 12/2016 Zhang ..................... B82Y 10/00
(Continued)

FOREIGN PATENT DOCUMENTS

JP    H02-188966 A    7/1990
JP    2009-246383 A    10/2009
(Continued)

OTHER PUBLICATIONS

Takato et al., "Impact of Surrounding Gate Transistor(SGT) for Ultra-High-Density LSI's": IEEE Transaction on Electron Devices, vol. 38, No. 3, pp. 573-578 (1991).
(Continued)

*Primary Examiner* — Mohammad M Hoque
(74) *Attorney, Agent, or Firm* — Crowell & Moring LLP

(57) ABSTRACT

A $SiO_2$ layer is disposed in the bottom portion of a Si pillar and on an i-layer substrate. A gate $HfO_2$ layer 11b is disposed so as to surround the side surface of the Si pillar, and a gate TiN layer is disposed so as to surround the $HfO_2$ layer. $P^+$ layers are disposed that contain an acceptor impurity at a high concentration, serve as a source and a drain, and are simultaneously or separately formed by a selective epitaxial crystal growth method on the exposed side surface of the bottom portion of and on the top portion of the Si pillar. Thus, an SGT is formed on the i-layer substrate.

8 Claims, 37 Drawing Sheets

(51) Int. Cl.
*H01L 29/66* (2006.01)
*H01L 21/02* (2006.01)
*H01L 29/423* (2006.01)
*H01L 29/49* (2006.01)
*H01L 29/51* (2006.01)

(52) U.S. Cl.
CPC .... *H01L 29/7848* (2013.01); *H01L 21/02238* (2013.01); *H01L 21/02255* (2013.01); *H01L 29/42376* (2013.01); *H01L 29/4966* (2013.01); *H01L 29/517* (2013.01)

(58) Field of Classification Search
CPC ......... H01L 21/02255; H01L 29/42376; H01L 29/4966; H01L 29/517; H01L 29/165; H01L 29/6656; H01L 29/78642; H01L 29/1033; H01L 29/41741
USPC ........................................................ 257/329
See application file for complete search history.

(56) References Cited

U.S. PATENT DOCUMENTS

| | | | |
|---|---|---|---|
| 9,640,636 B1 | 5/2017 | Bentley et al. | |
| 9,748,359 B1* | 8/2017 | Gluschenkov | H01L 21/2236 |
| 9,761,726 B1* | 9/2017 | Balakrishnan | H01L 29/78642 |
| 9,773,708 B1* | 9/2017 | Zhang | H01L 29/66666 |
| 9,799,751 B1* | 10/2017 | Zhang | H01L 29/7827 |
| 9,806,191 B1* | 10/2017 | He | H01L 29/42364 |
| 10,141,448 B1* | 11/2018 | Miao | H01L 27/088 |
| 10,164,057 B1* | 12/2018 | Jeon | H01L 29/78642 |
| 10,269,956 B2* | 4/2019 | Leobandung | H01L 21/823487 |
| 10,276,664 B2* | 4/2019 | Yu | H01L 29/1037 |
| 10,461,173 B1* | 10/2019 | Jacob | H01L 29/66545 |
| 10,505,019 B1* | 12/2019 | Miao | H01L 29/66666 |
| 10,665,569 B2* | 5/2020 | Yun | H01L 29/7827 |
| 10,686,057 B2* | 6/2020 | Lee | H01L 21/2257 |
| 2010/0270611 A1* | 10/2010 | Masuoka | H01L 21/84 257/329 |
| 2013/0221414 A1* | 8/2013 | Zhao | H01L 29/66795 257/E21.409 |
| 2017/0222045 A1* | 8/2017 | Leobandung | H01L 29/78642 |
| 2018/0006024 A1* | 1/2018 | Anderson | H01L 29/66666 |
| 2019/0386135 A1* | 12/2019 | Li | H01L 29/66666 |

FOREIGN PATENT DOCUMENTS

| | | |
|---|---|---|
| JP | 2011-108895 A | 6/2011 |
| WO | WO 2018/033981 A1 | 2/2018 |

OTHER PUBLICATIONS

Ting et al., "Study of planarized sputter-deposited SiO2" J.Vac.Sci. Technol, 15(3), pp. 1105-1112, May/Jun. 1978.
International Search Report and Written Opinion for Application No. PCT/JP2018/020383, dated Aug. 28, 2018, including English translation, 8 pages.
International Preliminary Report on Patentability, English Translation, for Application No. PCT/JP2018/020383, dated Dec. 10, 2020, 6 pages.

* cited by examiner

FIG. 1IA
FIG. 1IC
FIG. 1IB
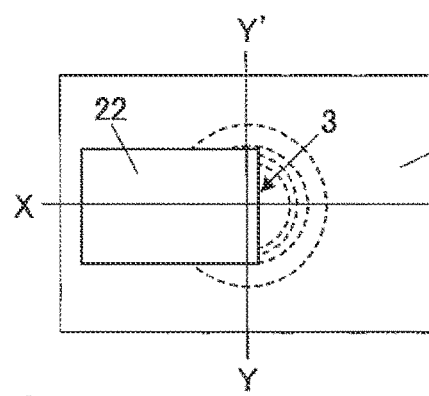
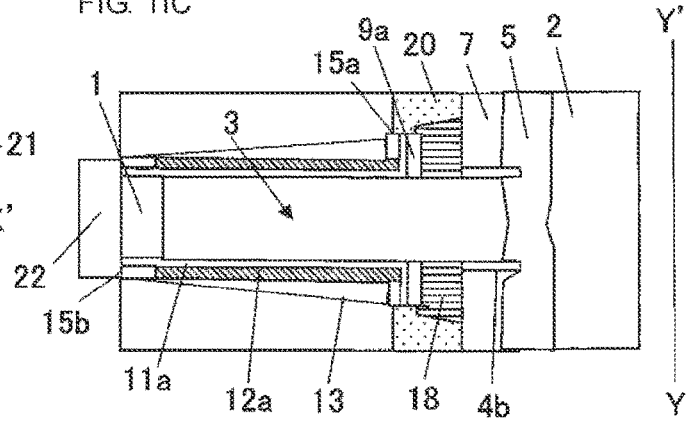
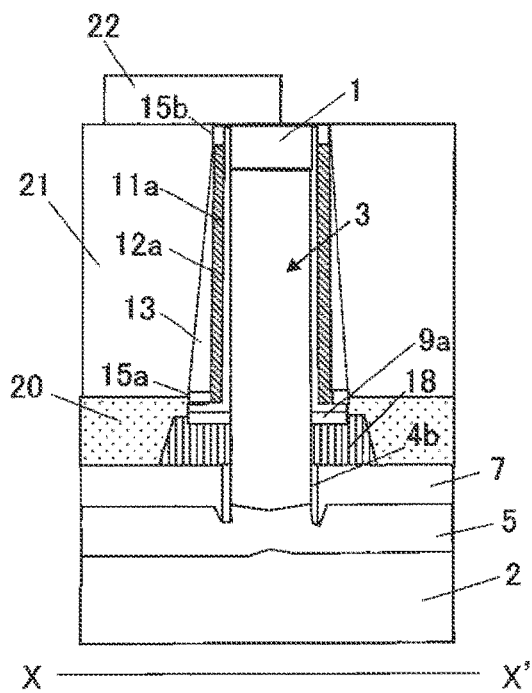

SEMICONDUCTOR DEVICE HAVING SEMICONDUCTOR PILLAR WITH FIRST IMPURITY REGION FORMED LOWER PART OF THE PILLAR AND SECOND IMPURITY REGION FORMED UPPER PART OF THE PILLAR

CROSS REFERENCES TO RELATED APPLICATIONS

The present application is a continuation application of PCT/JP2018/020383, filed May 28, 2018, the entire contents of which are incorporated herein by reference.

BACKGROUND OF THE INVENTION

1. Field of the Invention

The present invention relates to a pillar-shaped semiconductor device and a method for producing the pillar-shaped semiconductor device.

2. Description of the Related Art

In these years, three-dimensional transistors have been used in LSI (Large Scale Integration). In particular, surrounding gate transistors (SGTs), which are pillar-shaped semiconductor devices, have been attracting attention as semiconductor elements that provide highly integrated semiconductor devices. There has been a demand for an SGT-including semiconductor device that has a higher degree of integration and a higher performance.

Ordinary planar MOS transistors have a channel that extends in a horizontal direction along the upper surface of the semiconductor substrate. By contrast, SGTs have a channel that extends in a direction perpendicular to the upper surface of the semiconductor substrate (for example, refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, compared with planar MOS transistors, SGTs enable an increase in the density of semiconductor devices.

FIG. 7 is a schematic structural view of an N-channel SGT. A Si pillar 100 of a P or i (intrinsic) conductivity type (hereafter, silicon semiconductor pillars will be referred to as "Si pillars") has, in its upper and lower portions, N$^+$ layers 101*a* and 101*b* one of which functions as a source and the other one of which functions as a drain (hereafter, semiconductor regions containing a donor impurity at a high concentration will be referred to as "N$^+$ layers"). A portion of the Si pillar 100 between the N$^+$ layers 101*a* and 101*b*, which function as a source and a drain, functions as a channel region 102. Around this channel region 102, a gate insulating layer 103 is formed. Around this gate insulating layer 103, a gate conductor layer 104 is formed. In the SGT, the N$^+$ layers 101*a* and 101*b* functioning as the source and the drain, the channel region 102, the gate insulating layer 103, and the gate conductor layer 104 are formed so as to constitute a pillar. Thus, in plan view, the area occupied by the SGT corresponds to the area occupied by a single source-or-drain N$^+$ layer of a planar MOS transistor. Therefore, compared with a circuit chip including a planar MOS transistor, an SGT-including circuit chip enables a further reduction in the size of the chip.

In the SGT illustrated in FIG. 7, there has been a demand for a reduction in the resistance of N$^+$ layers 101*a* and 101*b* serving as the source and the drain. Such a reduction in the resistance of the N$^+$ layers 101*a* and 101*b* enables a decrease in the power consumption of and an increase in the speed of the SGT-including circuit. There has been a demand for a higher degree of integration of an SGT-including circuit.

SUMMARY OF THE INVENTION

There has been a demand for a pillar-shaped semiconductor device having a higher density, a lower power consumption, and a higher speed.

A pillar-shaped semiconductor device according to an aspect of the present invention includes:
a semiconductor pillar standing on and in a direction perpendicular to a substrate;
a gate insulating layer surrounding the semiconductor pillar;
a gate conductor layer surrounding the gate insulating layer;
a first impurity region surrounding, with a constant width in plan view, a side surface of a lower portion of the semiconductor pillar, containing an acceptor or donor impurity, and being constituted by a single layer or a plurality of layers; and
a second impurity region located on a top portion or a side surface of the semiconductor pillar and containing an acceptor or donor impurity,
wherein an upper surface of the first impurity region is located, in the perpendicular direction, at a level of a lower end of the gate insulating layer,
a lower end of the second impurity region is located, in the perpendicular direction, at a level of an upper end of the gate insulating layer,
the first impurity region and the second impurity region serve as a source and a drain, and
the first impurity region and the second impurity region are monocrystalline.

The pillar-shaped semiconductor device desirably further includes an oxide insulating layer in a bottom portion of the semiconductor pillar and in a surface layer of the substrate, the surface layer being connected to the bottom portion.

In the pillar-shaped semiconductor device, desirably, an upper surface of the oxide insulating layer within the semiconductor pillar and a lower end of the first impurity region are separated from each other in the perpendicular direction.

The pillar-shaped semiconductor device desirably further includes:
a first conductor region surrounding, with a constant width in plan view, the first impurity region, and being constituted by a single layer or a plurality of layers, and
a second conductor region connected to the first conductor region and extending in a horizontal direction.

In the pillar-shaped semiconductor device, desirably, the second impurity region includes
a third impurity region connected to an upper surface of the semiconductor pillar, and extending upwardly in the perpendicular direction from the upper surface of the semiconductor pillar while keeping, in plan view of the upper surface of the semiconductor pillar, a shape of a top portion of the semiconductor pillar, and
a fourth impurity region connected to an upper surface of the third impurity region, and having an outer peripheral edge extending, in plan view of the upper surface of the third impurity region, beyond an outer peripheral edge of the third impurity region.

In the pillar-shaped semiconductor device, desirably, the semiconductor pillar includes a first semiconductor pillar in contact with the first impurity region, and a second semiconductor pillar located above the first semiconductor pillar, and in plan view, an outer periphery of the first semiconductor pillar is located outside of an outer periphery of the second semiconductor pillar.

The pillar-shaped semiconductor device desirably further includes a fifth impurity region disposed so as to be connected to, within the semiconductor pillar, the first impurity region, wherein, in the perpendicular direction, an upper end of the fifth impurity region is located at a level of an upper end of the first semiconductor pillar.

The pillar-shaped semiconductor device desirably further includes, on or within the semiconductor pillar, an insulating layer having a lower end located, in the perpendicular direction, at a level of an upper end of the second impurity region.

In the pillar-shaped semiconductor device, desirably, in the perpendicular direction, the second impurity region surrounds a side surface of the semiconductor pillar, and a top portion of the semiconductor pillar, the top portion being connected to the side surface.

A method for producing a pillar-shaped semiconductor device according to another aspect of the present invention includes:

a step of forming a semiconductor pillar standing on and in a direction perpendicular to a substrate;

a step of forming a first material layer covering the semiconductor pillar and being constituted by a single layer or a plurality of material layers including, as an outermost layer, an insulating layer;

a step of removing a portion of the first material layer located under, in the perpendicular direction, the semiconductor pillar, and exposing a portion of a side surface of the semiconductor pillar; and a step of forming, by a selective epitaxial crystal growth method, a first impurity region being in contact with and surrounding, with a constant width, the exposed side surface of the semiconductor pillar, containing a donor or acceptor impurity, and being constituted by a single layer or a plurality of layers, wherein the first impurity region is monocrystalline, and serves as a source or a drain.

In the method for producing a pillar-shaped semiconductor device, desirably, the substrate includes a semiconductor layer, the method further includes:

a step of forming an oxidation-resistant material layer so as to cover the semiconductor pillar, a step of exposing an upper surface of the semiconductor layer in an outer peripheral region of the semiconductor pillar, and a step of forming an oxide insulating layer in the exposed upper surface of the semiconductor layer, and in a bottom portion of the semiconductor pillar, the bottom portion being connected to the upper surface.

In the method for producing a pillar-shaped semiconductor device, desirably, the oxide insulating layer is formed so as to be separated from the first impurity region.

The method for producing a pillar-shaped semiconductor device desirably further includes:

a step of forming a first conductor region surrounding, with a constant width in plan view, the first semiconductor region, and being constituted by a single layer or a plurality of layers, and a step of forming a second conductor region so as to be connected to the first conductor region and to extend in a horizontal direction.

In the method for producing a pillar-shaped semiconductor device, desirably, the second impurity region includes a third impurity region connected to an upper surface of the semiconductor pillar, and extending upwardly in the perpendicular direction from the upper surface of the semiconductor pillar while keeping, in plan view of the upper surface of the semiconductor pillar, a shape of a top portion of the semiconductor pillar, and a fourth impurity region connected to an upper surface of the third impurity region, and having an outer peripheral edge extending, in plan view of the upper surface of the third impurity region, beyond an outer peripheral edge of the third impurity region.

In the method for producing a pillar-shaped semiconductor device, desirably, after formation of the first impurity region, a portion of an outer periphery of the semiconductor pillar, the portion being located above an upper end of the first impurity region in the perpendicular direction, is removed with a constant width to form a first semiconductor pillar in contact with the first impurity region, and a second semiconductor pillar located above the first semiconductor pillar.

The method for producing a pillar-shaped semiconductor device desirably further includes a step of, after formation of the first impurity region, performing heat treatment to form a fifth impurity region so as to be connected to, within the semiconductor pillar, the first impurity region, wherein, in the perpendicular direction, an upper end of the fifth impurity region is located at a level of an upper end of the first semiconductor pillar.

The method for producing a pillar-shaped semiconductor device desirably further includes:

a step of forming a first insulating layer within an upper portion or on a top portion of the semiconductor pillar, and a step of forming, by a selective epitaxial crystal growth method, the first impurity region in contact with a side surface of the semiconductor pillar, the side surface being located below the first insulating layer in the perpendicular direction.

In the method for producing a pillar-shaped semiconductor device, desirably, in the perpendicular direction, a second impurity region is formed so as to surround a side surface of the semiconductor pillar and a top portion of the semiconductor pillar, the top portion being connected to the side surface.

The present invention provides a pillar-shaped semiconductor device having a higher density, a lower power consumption, and a higher speed.

BRIEF DESCRIPTION OF THE DRAWINGS

FIGS. 1IA to 1IC are a plan view and sectional structural views that illustrate a method for producing an SGT-including pillar-shaped semiconductor device according to a first embodiment.

FIGS. 1OA to 1OC are a plan view and sectional structural views that illustrate a method for producing an SGT-including pillar-shaped semiconductor device according to a first embodiment.

FIGS. 3IA to 3IC are a plan view and sectional structural views that illustrate a method for producing an SGT-including pillar-shaped semiconductor device according to a third embodiment of the present invention.

DESCRIPTION OF THE PREFERRED EMBODIMENTS

Hereinafter, methods for producing pillar-shaped semiconductor devices according to embodiments of the present invention will be described with reference to drawings.

First Embodiment

Hereinafter, with reference to FIG. 1AA to FIG. 1PC, a method for producing an SGT-including pillar-shaped semiconductor device according to a first embodiment of the present invention will be described. Among FIG. 1AA to FIG. 1PC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A.

Figure 1A:
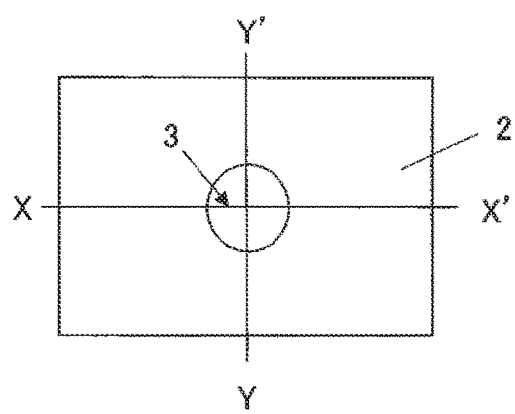
FIGS. 1AA to 1AC are a plan view and sectional structural views that illustrate a method for producing an SGT-including pillar-shaped semiconductor device according to a first embodiment.
Figure 1A:
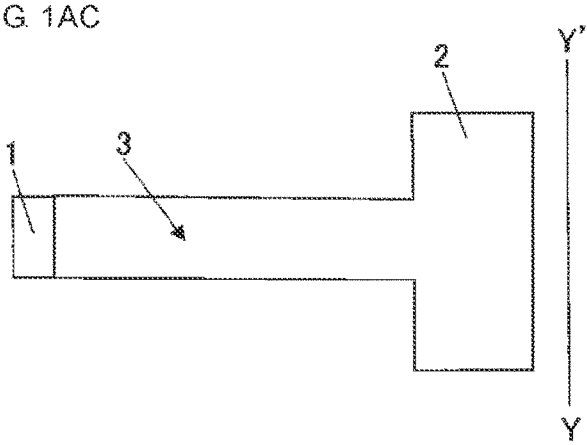
Figure 1A:
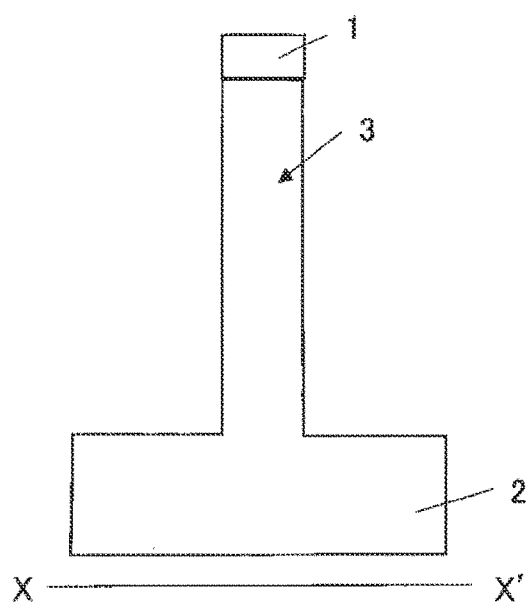

As illustrated in FIGS. 1AA to 1AC, an i-layer (intrinsic Si-layer) substrate (not shown) is etched through, as a mask, a mask material layer 1 formed on the i-layer substrate, having a circular shape in plan view, and including a $SiO_2$ layer, an aluminum oxide ($Al_2O_3$) layer, and a $SiO_2$ layer, to form a Si pillar 3 on the i-layer substrate 2. Incidentally, the i-layer substrate 2 and the Si pillar 3 may be formed of N-type or P-type Si containing a small amount of a donor or acceptor impurity.

Figure 1B:
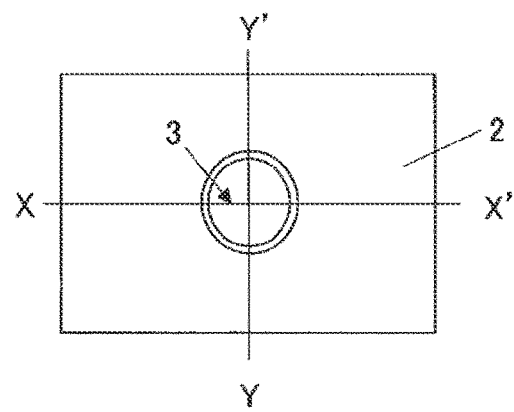
FIGS. 1BA to 1BC are a plan view and sectional structural views that illustrate a method for producing an SGT-including pillar-shaped semiconductor device according to a first embodiment.
Figure 1B:
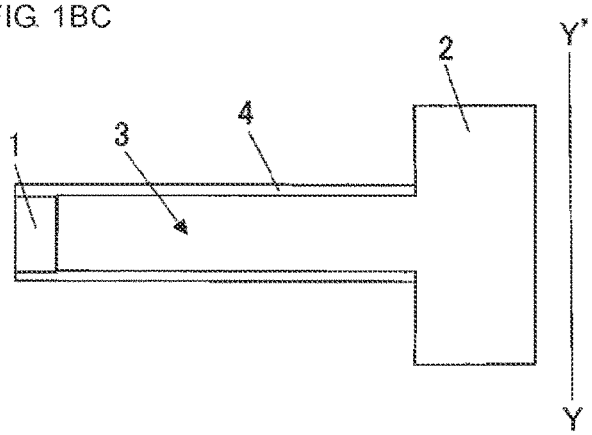
Figure 1B:
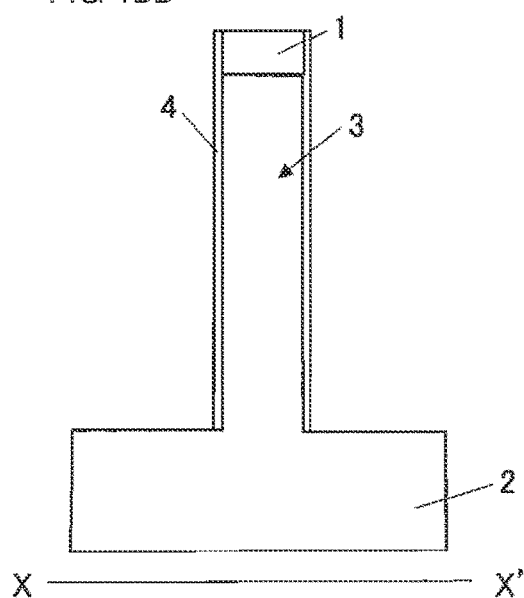

Subsequently, as illustrated in FIGS. 1BA to 1BC, an ALD (Atomic Layer Deposition) method is performed to cover the entire structure with a lower layer that is a $SiO_2$ layer (not shown) and an upper layer that is a SiN layer (not shown). Subsequently, an RIE (Reactive Ion Etching) method is performed to etch off the $SiO_2$ layer and the SiN layer from the top of the i-layer substrate 2 and the mask material layer 1. This leaves a $SiO_2$ layer/SiN layer 4 on the side surfaces of the Si pillar 3 and the mask material layer 1.

Figure 1C:
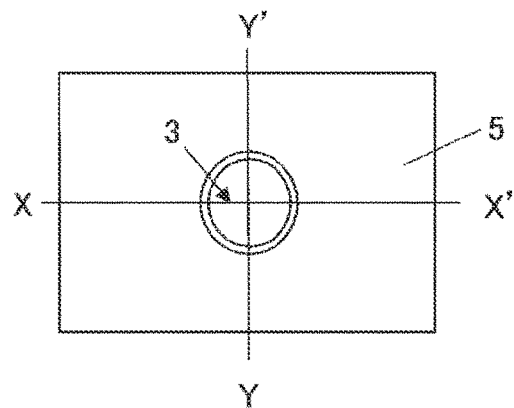
FIGS. 1CA to 1CC are a plan view and sectional structural views that illustrate a method for producing an SGT-including pillar-shaped semiconductor device according to a first embodiment.
Figure 1C:
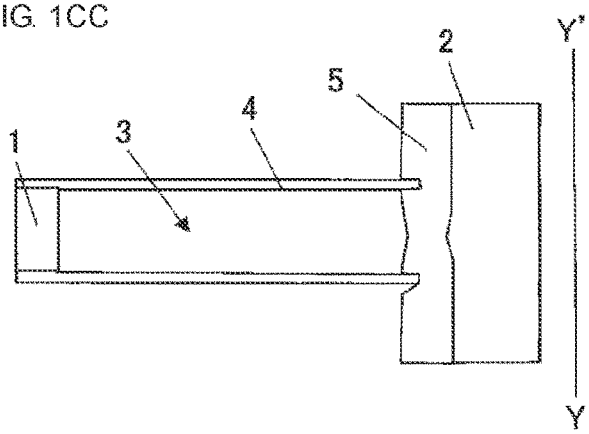
Figure 1C:
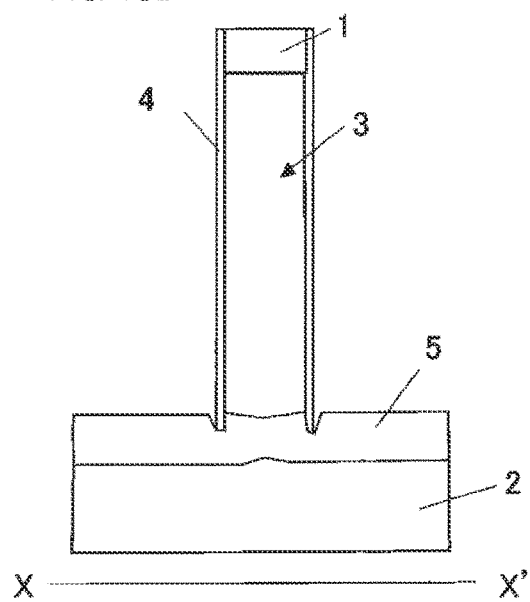

Subsequently, as illustrated in FIGS. 1CA to 1CC, a thermal oxidation method is performed to form a $SiO_2$ layer 5 in the upper surface of the i-layer substrate 2 and in the bottom portion of the Si pillar 3.

Figure 1D:
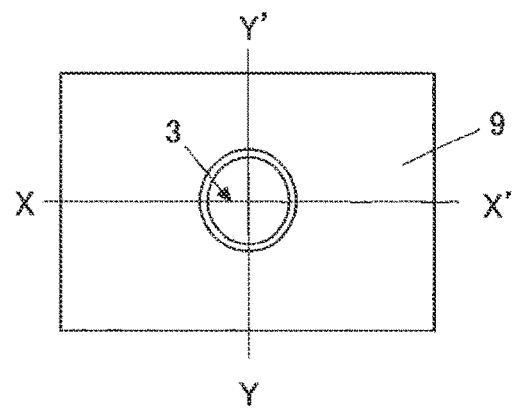
FIGS. 1DA to 1DC are a plan view and sectional structural views that illustrate a method for producing an SGT-including pillar-shaped semiconductor device according to a first embodiment.
Figure 1D:
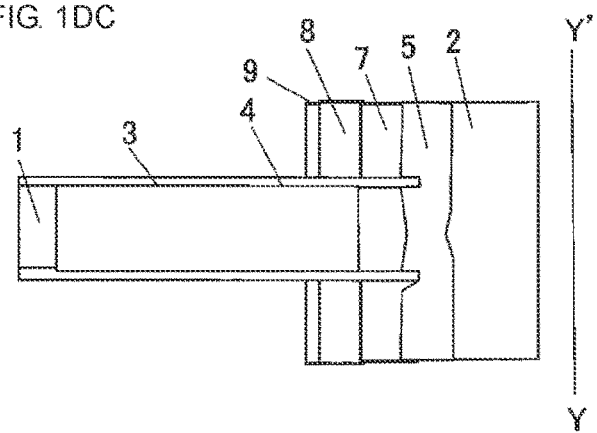
Figure 1D:
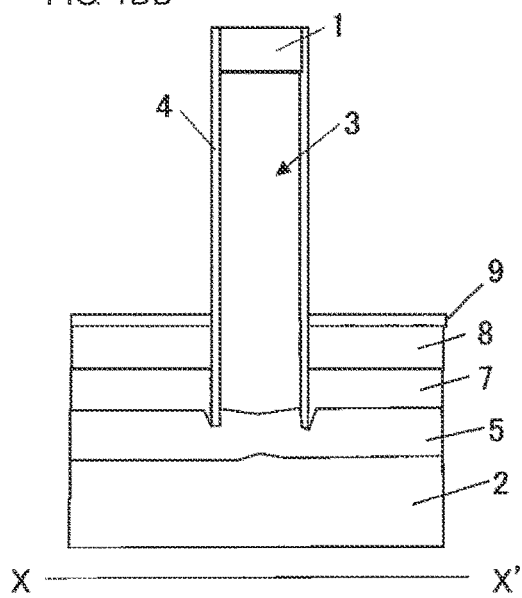

Subsequently, as illustrated in FIGS. 1DA to 1DC, on the $SiO_2$ layer 5 surrounding the Si pillar 3, a SiN layer 7, a $SiO_2$ layer 8, and a SiN layer 9 are formed.

Figure 1E:
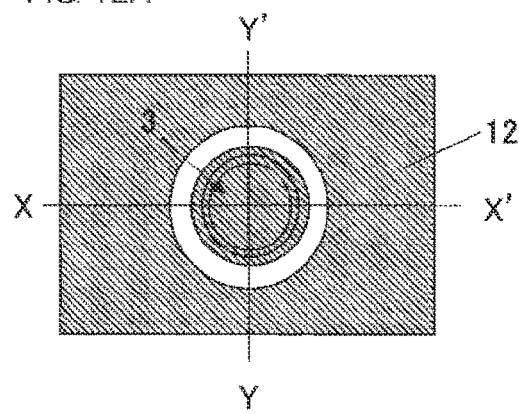
FIGS. 1EA to 1EC are a plan view and sectional structural views that illustrate a method for producing an SGT-including pillar-shaped semiconductor device according to a first embodiment.
Figure 1E:
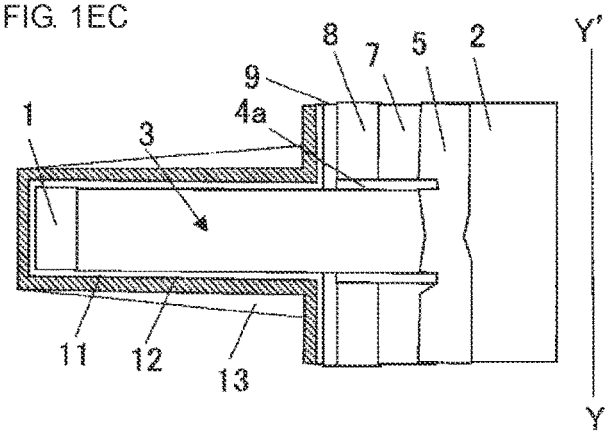
Figure 1E:
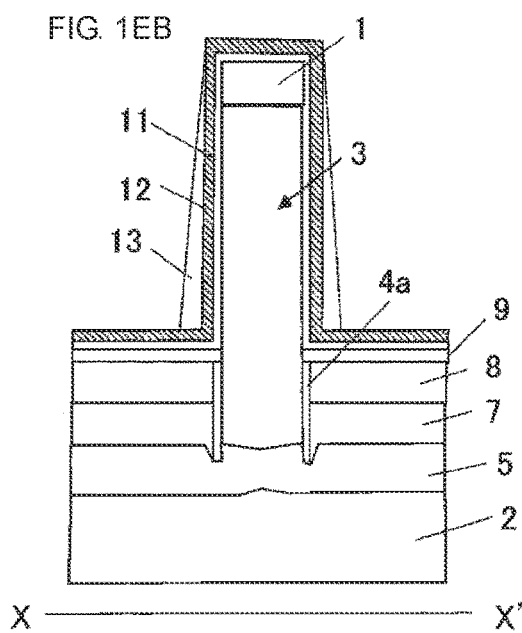

Subsequently, as illustrated in FIGS. 1EA to 1EC, an ALD method is performed to cover the entire structure with a gate insulating layer that is a hafnium oxide ($HfO_2$) layer 11 and a gate conductor layer that is a titanium nitride (TiN) layer 12. Subsequently, the entire structure is covered with a lower layer that is a SiN layer (not shown) and an upper layer that is a $SiO_2$ layer (not shown). Subsequently, an RIE method is performed to etch off the SiN/$SiO_2$ layer on the top portion of and outer peripheral region around the Si pillar 3, to thereby form a SiN/$SiO_2$ layer 13 surrounding the side surface of the Si pillar 3.

Figure 1F:
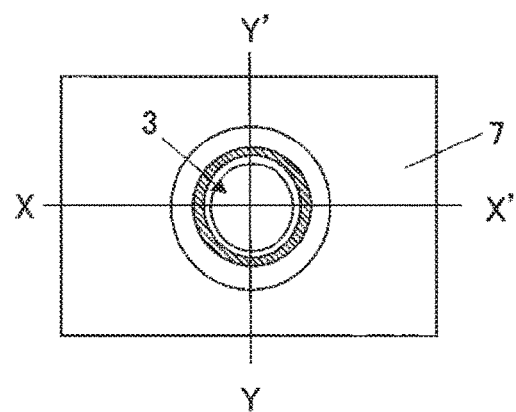
FIGS. 1FA to 1FC are a plan view and sectional structural views that illustrate a method for producing an SGT-including pillar-shaped semiconductor device according to a first embodiment.
Figure 1F:
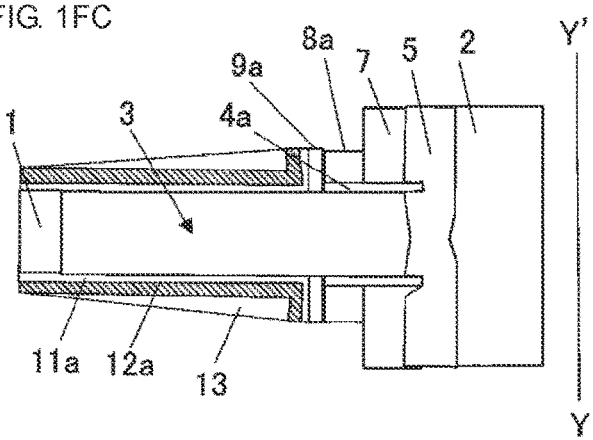
Figure 1F:
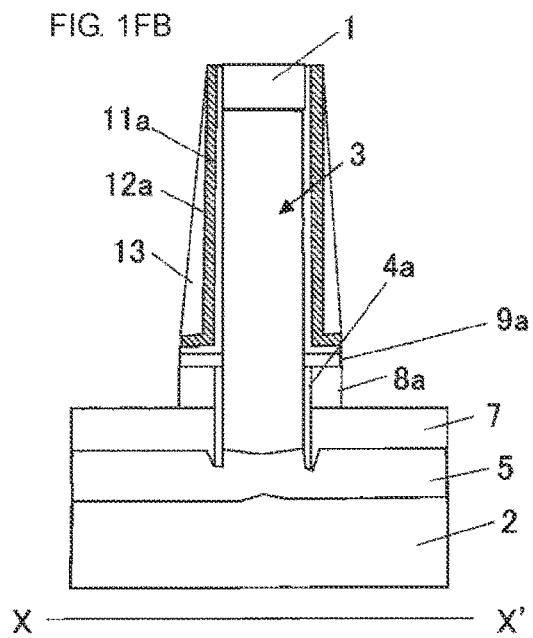

Subsequently, as illustrated in FIGS. 1FA to 1FC, the TiN layer 12, the $HfO_2$ layer 11, the SiN layer 9, and the $SiO_2$ layer 8 are etched through, as masks, the mask material layer 1 and the SiN/$SiO_2$ layer 13, to form a TiN layer 12a, a $HfO_2$ layer 11a, a SiN layer 9a, and a $SiO_2$ layer 8a.

Figure 1G:
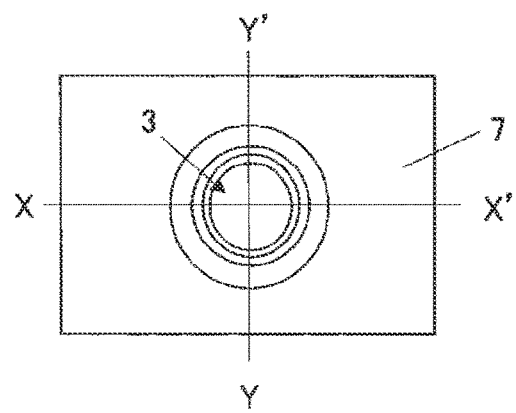
FIGS. 1GA to 1GC are a plan view and sectional structural views that illustrate a method for producing an SGT-including pillar-shaped semiconductor device according to a first embodiment.
Figure 1G:
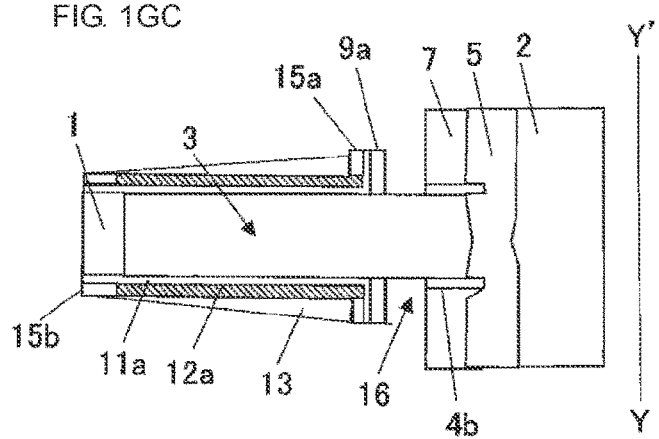
Figure 1G:
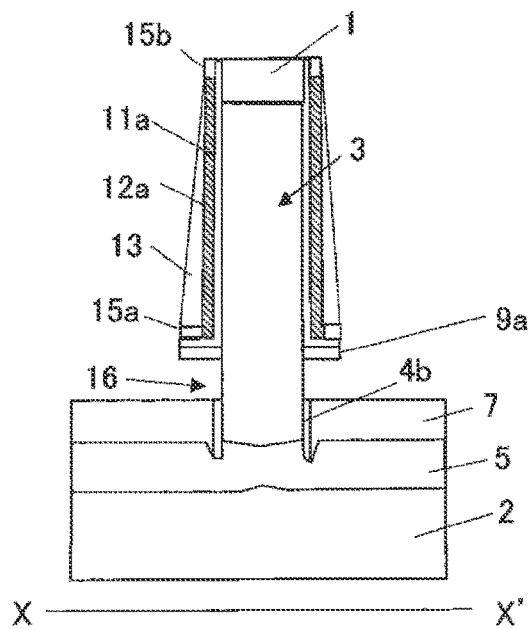

Subsequently, as illustrated in FIGS. 1GA to 1GC, the exposed portions of the TiN layer 12a are oxidized to form oxidized TiN layers 15a and 15b. Subsequently, the $SiO_2$ layer 8a is etched off to form an opening portion 16 through which the side surface of the bottom portion of the Si pillar 3 is exposed.

Figure 1H:
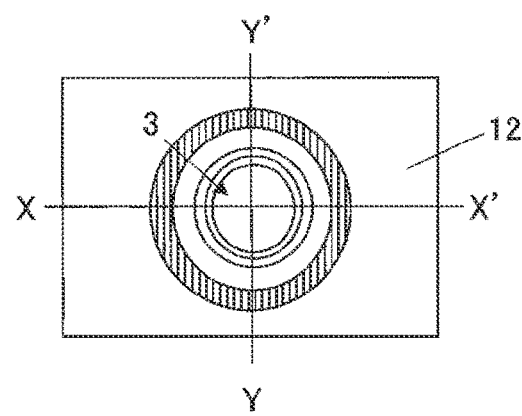
FIGS. 1HA to 1HC are a plan view and sectional structural views that illustrate a method for producing an SGT-including pillar-shaped semiconductor device according to a first embodiment.
Figure 1H:
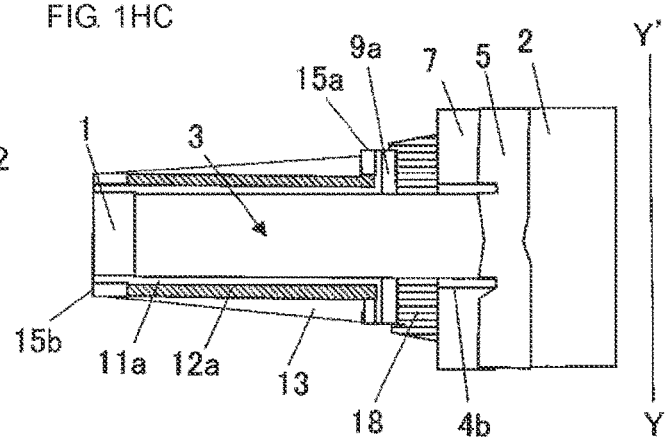
Figure 1H:
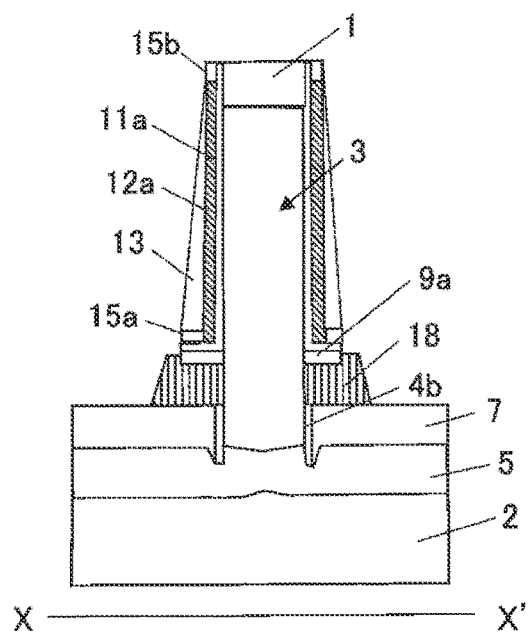

Subsequently, as illustrated in FIGS. 1HA to 1HC, a $P^+$ layer 18 containing an acceptor impurity at a high concentration and constituted by a single layer or a plurality of layers is formed by a selective epitaxial crystal growth method so as to be in contact with the exposed side surface of the Si pillar 3 in the opening portion 16. The Si pillar 3, which has a circular shape in plan view, enables a reduction in predominance of plane orientations in the side surface of the Si pillar 3. Thus, the $P^+$ layer surrounding the Si pillar 3 is formed so as to have a substantially constant width in plan view. Incidentally, when the $P^+$ layer 18 is formed as a plurality of layers, it may be formed as layers different from each other in semiconductor material.

Subsequently, as illustrated in FIGS. 1IA to 1IC, a W layer 20 is formed in contact with the $P^+$ layer 18 and on the SiN layer 7 so as to have an underlying layer that is a thin buffer metal layer (not shown) for reducing the connection resistance with the $P^+$ layer 18. Subsequently, a $SiO_2$ layer (not shown) is formed so as to cover the entire structure. Subsequently, a CMP (Chemical Mechanical Polishing) method is performed to polish the $SiO_2$ layer such that the level of the upper surface is lowered to the level of the upper surface of the mask material layer 1. Thus, a $SiO_2$ layer 21 is formed. Subsequently, on the $SiO_2$ layer 21, a resist layer 22 is formed so as to partially overlap the Si pillar 3 in plan view.

Figure 1J:
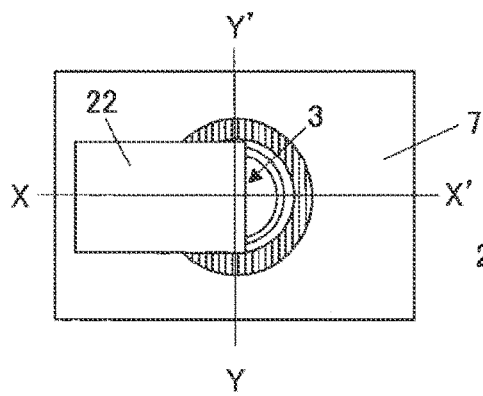
FIGS. 1JA to 1JC are a plan view and sectional structural views that illustrate a method for producing an SGT-including pillar-shaped semiconductor device according to a first embodiment.
Figure 1J:
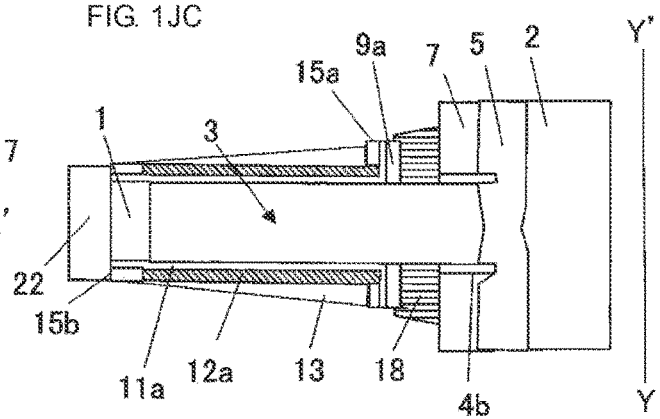
Figure 1J:
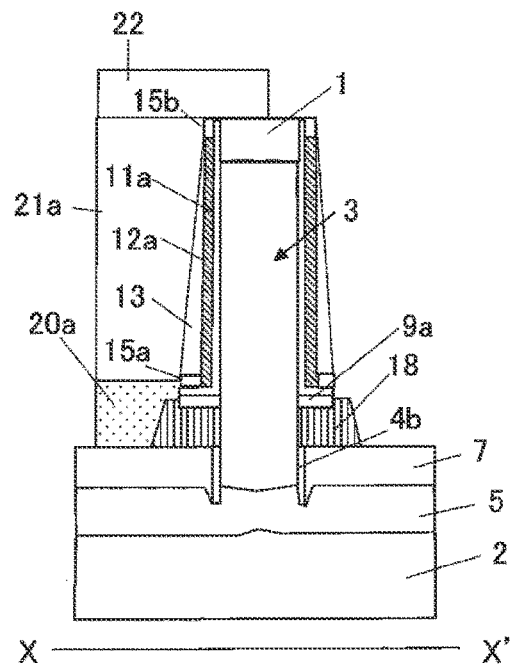

Subsequently, as illustrated in FIGS. 1JA to 1JC, the $SiO_2$ layer 21 and the W layer 20 are etched through, as masks, the mask material layer 1, the SiN/$SiO_2$ layer 13, and the resist layer 22. This forms a $P^+$ layer 18 having, in plan view, a ring shape surrounding the side surface of the Si pillar 3, and a W layer 20a located below the resist layer 22.

Figure 1K:
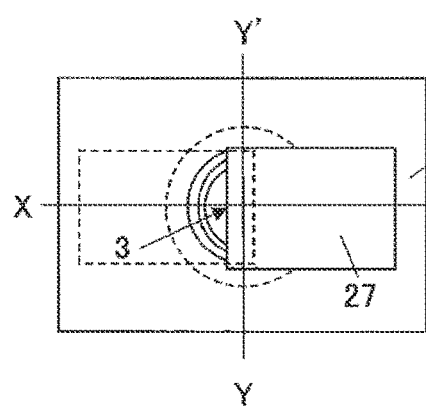
FIGS. 1KA to 1KC are a plan view and sectional structural views that illustrate a method for producing an SGT-including pillar-shaped semiconductor device according to a first embodiment.
Figure 1K:
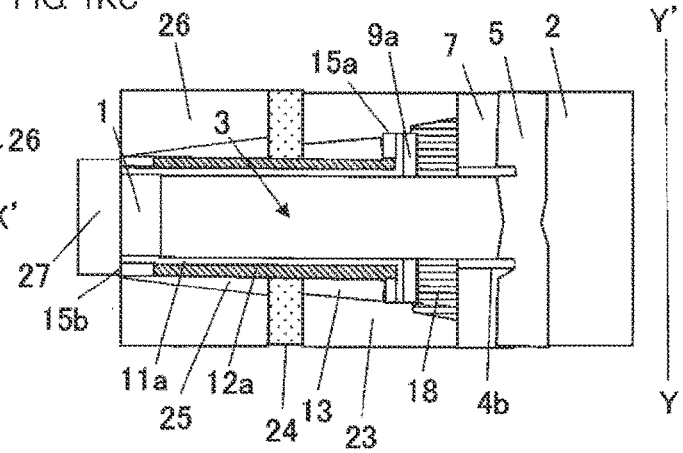
Figure 1K:
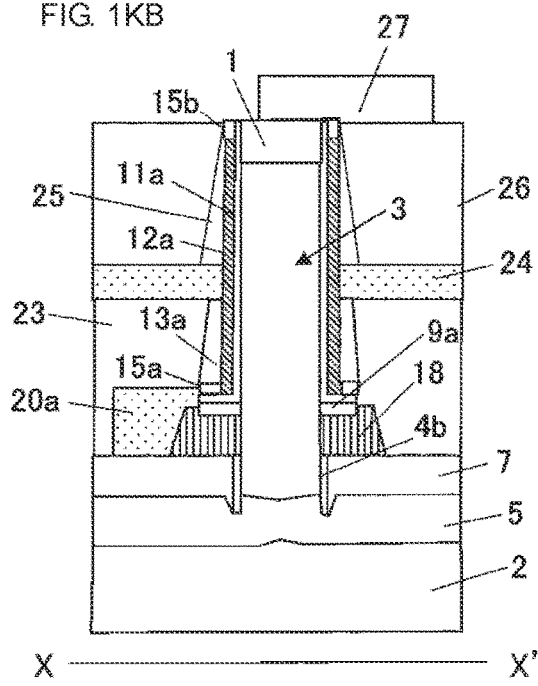

Subsequently, as illustrated in FIGS. 1KA to 1KC, the entire structure is covered with a SiN layer (not shown), and the SiN layer is polished by a CMP method such that the level of the upper surface is lowered to the level of the upper surface of the mask material layer 1. Subsequently, the SiN layer is etched by an etch back method to the middle height of the TiN layer 12a in the perpendicular direction. Thus, a SiN layer 23 is formed. Subsequently, the SiN/$SiO_2$ layer 13 that is located higher than the SiN layer 23 in the perpendicular direction is etched off, to form a SiN/$SiO_2$ layer 13a. Subsequently, a W layer 24 is formed on the SiN layer 23 so as to be in contact with the TiN layer 12a in plan view. Subsequently, the same method as in formation of the SiN/$SiO_2$ layer 13 in FIGS. 1EA to 1EC is performed to form a SiN/$SiO_2$ layer 25. Subsequently, a SiN layer 26 is formed, in plan view, in an outer peripheral region around the SiN/$SiO_2$ layer 25. Subsequently, a resist layer 27 is formed on the SiN layer 26 so as to partially overlap the Si pillar 3 in plan view. The resist layer 27 is formed so as to horizontally extend, in plan view, in a direction opposite to the extension direction of the W layer 20a.

Figure 1L:
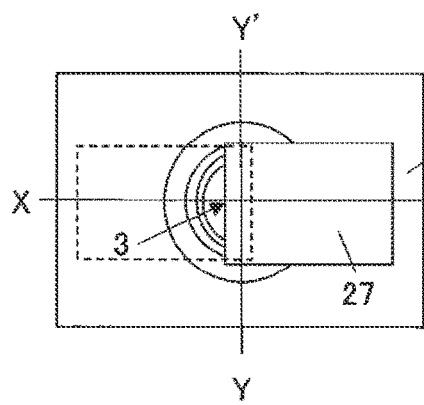
FIGS. 1LA to 1LC are a plan view and sectional structural views that illustrate a method for producing an SGT-including pillar-shaped semiconductor device according to a first embodiment.
Figure 1L:
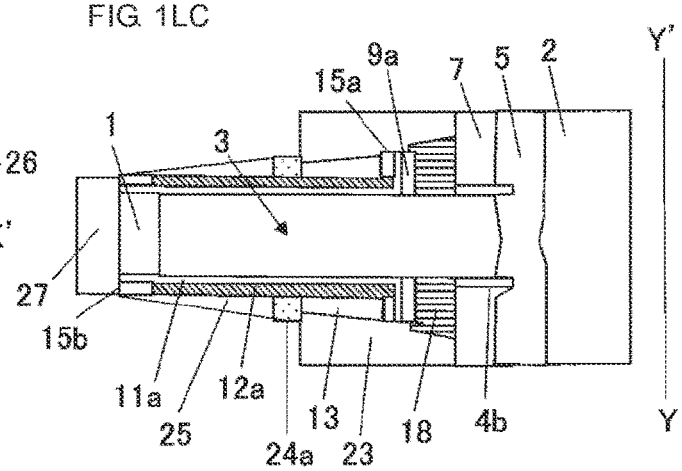
Figure 1L:
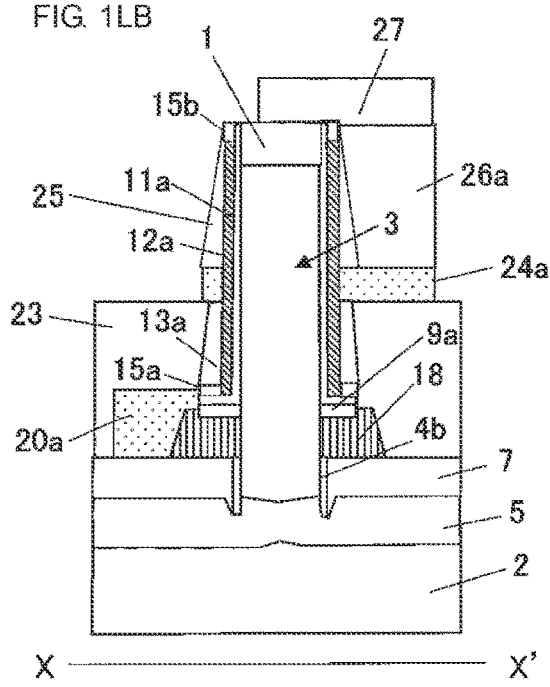

Subsequently, as illustrated in FIGS. 1LA to 1LC, the SiN layer 26 and the W layer 24 are etched through, as masks, the mask material layer 1, the SiN/$SiO_2$ layer 25, and the resist layer 27, to form a W layer 24a and a SiN layer 26a. Subsequently, the resist layer 27 is removed.

Figure 1M:
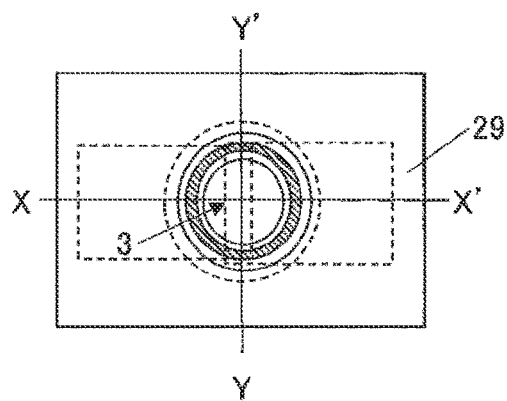
FIGS. 1MA to 1MC are a plan view and sectional structural views that illustrate a method for producing an SGT-including pillar-shaped semiconductor device according to a first embodiment.
Figure 1M:
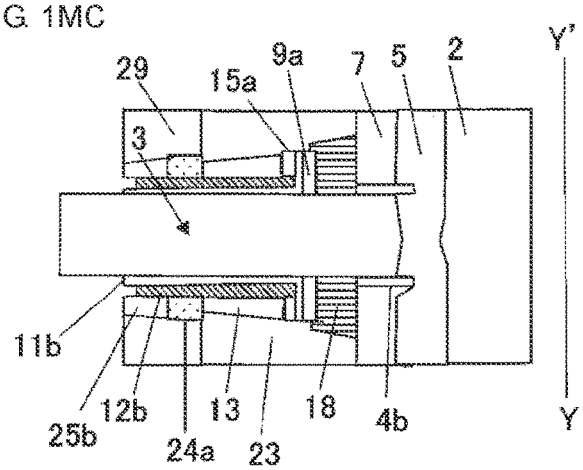
Figure 1M:
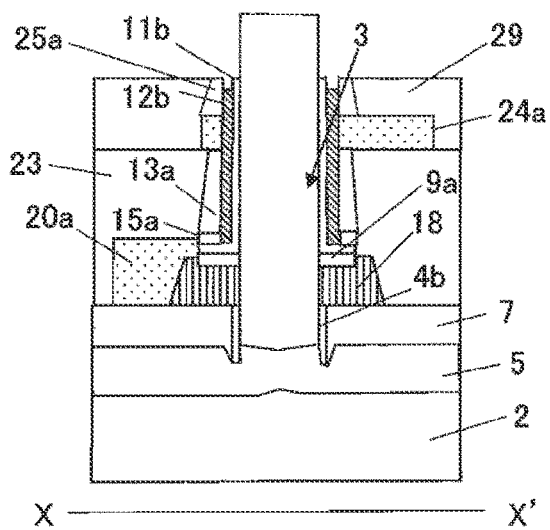

Subsequently, as illustrated in FIGS. 1MA to 1MC, the entire structure is covered with a SiN layer (not shown).

Subsequently, the SiN layer is polished by a CMP method such that the level of the upper surface is lowered to the level of the upper surface of the mask material layer 1. Subsequently, the mask material layer 1 is etched to the Al$_2$O$_3$ layer. The Al$_2$O$_3$ layer is etched by, for example, a room-temperature RIE method using a boron trichloride (BCl$_3$) gas. Subsequently, a back etch method is performed to etch the SiN layer, to thereby form a SiN layer 29.

Subsequently, the SiN/SiO$_2$ layer 25, the TiN layer 12a, and the HfO$_2$ layer 11a that are located higher than the SiN layer 29 in the perpendicular direction are etched off, to form a SiN/SiO$_2$ layer 25a, a TiN layer 12b, and a HfO$_2$ layer 11b. Subsequently, the top portion of the TiN layer 12b is etched off. Subsequently, the SiO$_2$ layer remaining on the top portion of the Si pillar 3 is removed. Thus, the upper portion of the Si pillar 3 in the perpendicular direction is exposed.

Figure 1N:
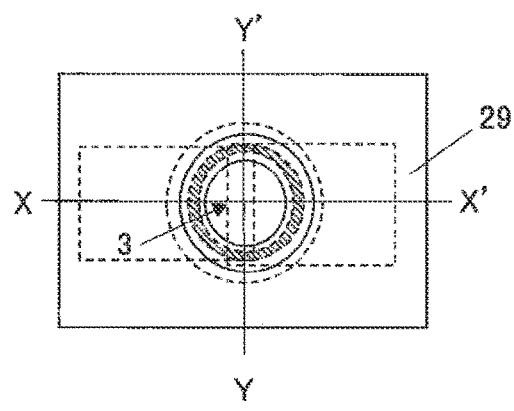
FIGS. 1NA to 1NC are a plan view and sectional structural views that illustrate a method for producing an SGT-including pillar-shaped semiconductor device according to a first embodiment.
Figure 1N:
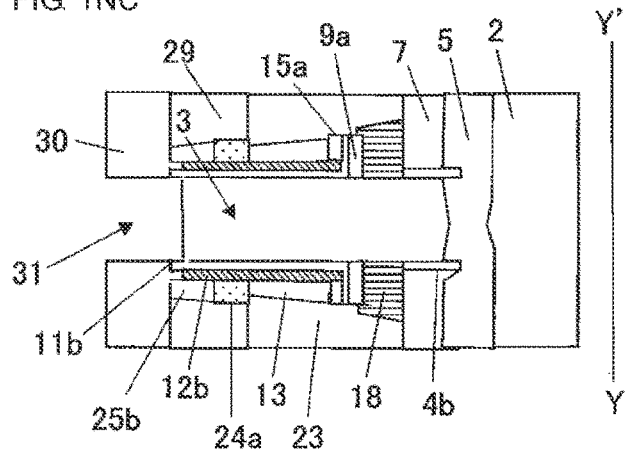
Figure 1N:
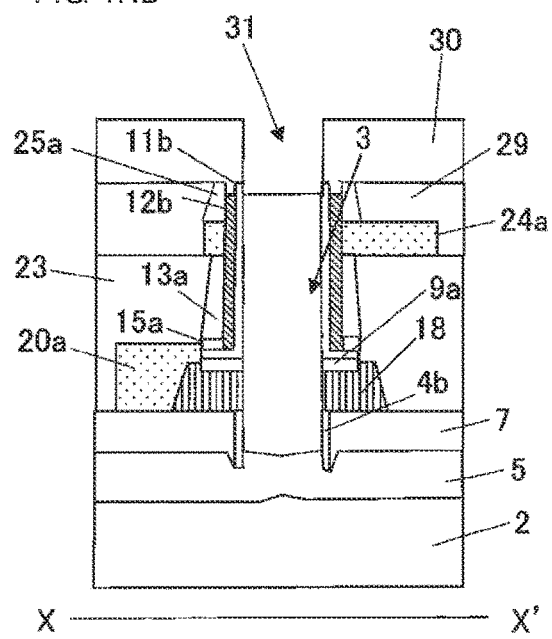

Subsequently, as illustrated in FIGS. 1NA to 1NC, the entire structure is covered with a SiO$_2$ layer (not shown). Subsequently, a CMP method is performed to polish the SiO$_2$ layer such that the level of the upper surface is lowered to the level of the upper surface of the Si pillar 3. Thus, a SiO$_2$ layer 30 is formed. Subsequently, the top portion of the Si pillar 3 is etched through the SiO$_2$ layer 30 serving as a mask to form a recessed portion 31. This etching is performed such that the level (in the perpendicular direction) of the bottom portion of the recessed portion 31 is lowered to the level of the upper end of the TiN layer 12b.

Subsequently, as illustrated in FIGS. 1OA to 1OC, in the recessed portion 31 above the Si pillar 3, a P$^+$ layer 32 containing an acceptor impurity at a high concentration is formed by a selective epitaxial crystal growth method. In this case, the P$^+$ layer 32 is formed by selective epitaxial crystal growth such that the level (in the perpendicular direction) of the top portion is higher than that of the SiO$_2$ layer 30.

Figure 1P:
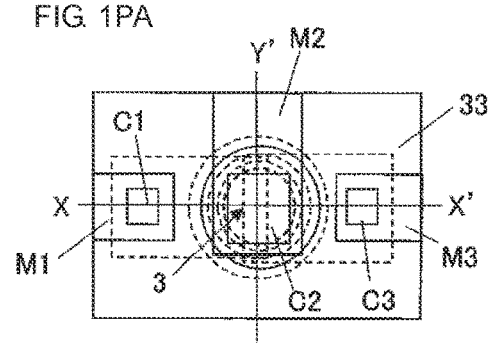
FIGS. 1PA to 1PC are a plan view and sectional structural views that illustrate a method for producing an SGT-including pillar-shaped semiconductor device according to a first embodiment.
Figure 1P:
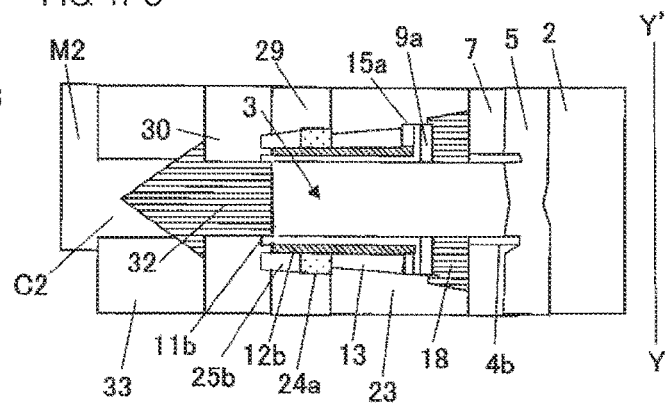
Figure 1P:
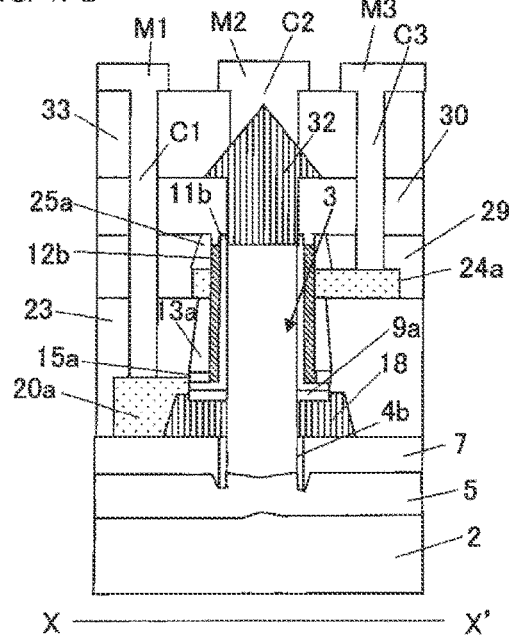

Subsequently, as illustrated in FIGS. 1PA to 1PC, the entire structure is covered with a SiO$_2$ layer (not shown). Subsequently, a CMP method is performed to provide a planarized surface to thereby form a SiO$_2$ layer 33. Subsequently, the SiO$_2$ layers 33 and 30 and the SiN layers 29 and 23 on the W layer 20a are etched to form a contact hole C1. Subsequently, the SiO$_2$ layer 33 on the P$^+$ layer 32 is etched to form a contact hole C2. Subsequently, the SiO$_2$ layers 33 and 30 and the SiN layer 29 on the W layer 24a are etched to form a contact hole C3. Subsequently, a metal wiring layer M1 is formed so as to be connected through the contact hole C1 to the W layer 20a; a metal wiring layer M2 is formed so as to be connected through the contact hole C2 to the P$^+$ layer 32; and a metal wiring layer M3 is formed so as to be connected through the contact hole C3 to the W layer 24a. Thus, an SGT is formed in which one of the P$^+$ layer 18 and the P$^+$ layer 32 serves as a source and the other serves as a drain; the TiN layer 12b serves as a gate conductor layer; the HfO$_2$ layer 11b serves as a gate insulating layer; and the Si pillar 3 between the P$^+$ layers 18 and 32 serves as a channel.

The first embodiment provides the following advantages.

1. As the density of a circuit increases, the diameter of the Si pillar 3 decreases. In this case, when, as in the related art, an impurity region for forming a PN junction is formed only within the Si pillar 3, the impurity region is limited within the narrow Si pillar 3, which inevitably results in an increase in the resistance of the PN junction serving as the source or drain. By contrast, in the present invention, without such limitation of the diameter of the Si pillar 3, the P$^+$ layer 18 is formed so as to surround the side surface of the bottom portion of the Si pillar 3 and have a volume sufficient for a low-resistance source or drain. The P$^+$ layer 18 is formed of a monocrystalline Si layer. This provides a decrease in the resistance of the source or drain.

2. Instead of Si layers, the P$^+$ layers 18 and 32 may be formed of, for example, silicon germanium (SiGe), to thereby generate a stress that increases the hole mobility within the Si pillar 3. This enables an increase in the speed of the SGT circuit. Alternatively, instead of SiGe, another semiconductor material layer may be selected that contains an acceptor or donor impurity at a high concentration and can be formed by selective epitaxial crystal growth, to thereby form a P-channel type or N-channel type SGT. This enables formation of a high-performance SGT circuit. The channel of an SGT may be formed of a semiconductor base material, and the source or drain may be formed of a different semiconductor base material to thereby achieve a high-performance SGT circuit.

3. The SiO$_2$ layer 5 formed in the bottom portion of the Si pillar 3 and the P$^+$ layers 18 and 32 formed of SiGe enable generation of a stress that further increases the hole mobility within the Si pillar 3. This enables a further increase in the speed of the SGT circuit.

4. The SiO$_2$ layer 5 is formed by a thermal oxidation method using, as masks, the mask material layer 1 and the SiO$_2$ layer/SiN layer 4 covering the Si pillar 3, so as to be in the bottom portion of the Si pillar 3 and in the upper surface of the i-layer substrate 2. In addition, while the SiO$_2$ layer/SiN layer 4 is left on the side surface of the bottom portion of the Si pillar 3, the P$^+$ layer 18 is formed so as to be located above (in the perpendicular direction) and separated from the upper end of the SiO$_2$ layer 5. This enables prevention of overlapping of the SiO$_2$ layer 5 and the P$^+$ layer 18 in the perpendicular direction. This enables prevention of an increase in the resistance of the source or drain caused by overlapping of the SiO$_2$ layer 5 and the P$^+$ layer 18 and by the resultant decrease in the contact area between the P$^+$ layer 18 and the Si surface of the side surface of the Si pillar 3. In addition, the side surface of the bottom portion of the Si pillar 3 on which the P$^+$ layer 18 is grown by selective epitaxial crystal growth can be separated from the interface (where stress concentration occurs) between the Si pillar 3 and the SiO$_2$ layer 5. This enables formation of the P$^+$ layer 18 of high crystallinity on the side surface of the bottom portion of the Si pillar 3.

5. The P$^+$ layer 32 is formed so as to include a lower region of the P$^+$ layer 32 connected to the upper surface of the Si pillar 3 and extending upwardly in the perpendicular direction from the top portion of the Si pillar 3 while, in plan view of the upper surface of the Si pillar 3, the shape of the top portion of the Si pillar 3 is kept; and an upper region of the P$^+$ layer 32 connected to the upper surface of the lower region, and having an outer peripheral edge extending, in plan view of the upper surface of the lower region, beyond the outer peripheral edge of the lower region of the P$^+$ layer 32. In this way, the upper-portion P$^+$ layer 32 can be formed so as to have, in plan view, a larger area than the Si pillar 3. In this case, the contact hole C2 for connection between the metal wiring layer M2 and the P$^+$ layer 32 can be formed with a sufficiently high tolerance of mask alignment.

Second Embodiment

Hereinafter, a method for producing an SGT-including pillar-shaped semiconductor device according to a second embodiment of the present invention will be described with reference to FIG. 2AA to FIG. 2CC. Among FIG. 2AA to FIG. 2CC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A. The production method of the second embodiment is the same as in the above-described steps of the first embodiment except for the following differences.

Figure 2A:
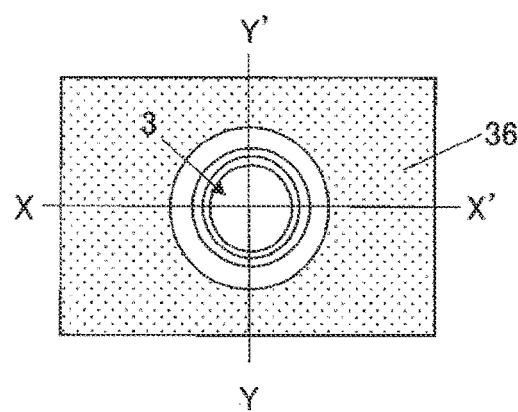
FIGS. 2AA to 2AC are a plan view and sectional structural views that illustrate a method for producing an SGT-including pillar-shaped semiconductor device according to a second embodiment of the present invention.
Figure 2A:
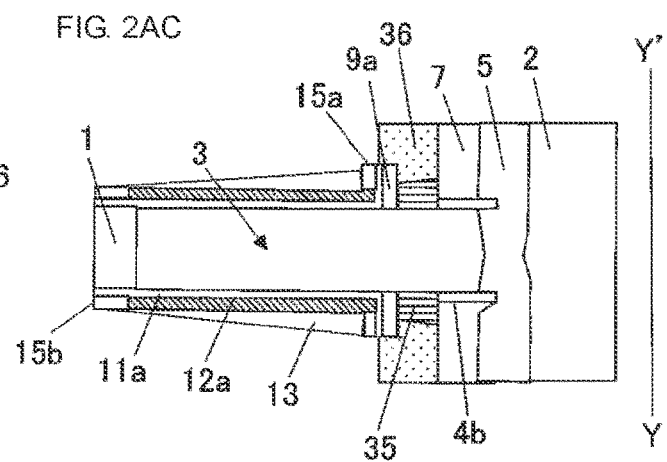
Figure 2A:
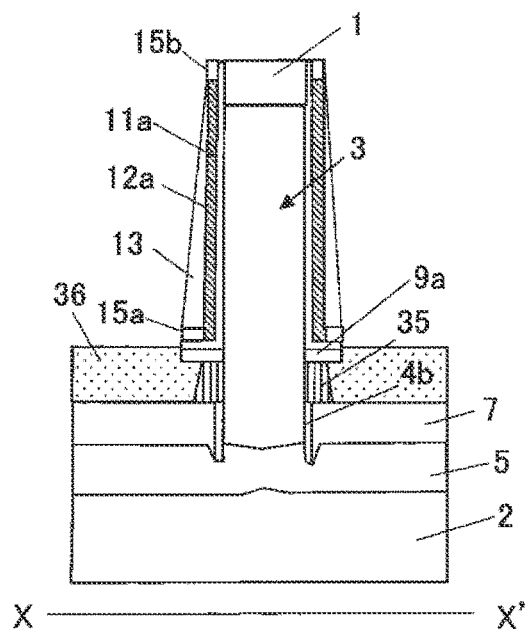

The same steps as in FIG. 1AA to FIG. 1GC are performed prior to a step illustrated in FIGS. 2AA to 2AC. Subsequently, a P$^+$ layer 35 containing an acceptor impurity at a high concentration is formed by a selective epitaxial crystal growth method so as to be in contact with the exposed side surface of the bottom portion of the Si pillar 3. In this case, the outer periphery of the P$^+$ layer 35 is formed so as to be, in plan view, within the outer periphery of the SiN/SiO$_2$ layer 13. Subsequently, an ALD method and a CVD (Chemical Vapor Deposition) method are performed to cover the entire structure with a W layer (not shown). Subsequently, the W layer is polished by a CMP method such that the level of the upper surface is lowered to the level of the upper surface of the mask material layer 1. Subsequently, the W layer is etched by an etch back method to form a W layer 36 connected to the P$^+$ layer 35. Incidentally, prior to formation of the W layer 36, a barrier metal layer, for example, a Ta layer, may be formed between the P$^+$ layer 35 and the W layer 36 in order to reduce the resistance between the P$^+$ layer 35 and the W layer 36. In this case, in plan view, the Ta layer is formed so as to surround, with a constant width, the P$^+$ layer 35.

Figure 2B:
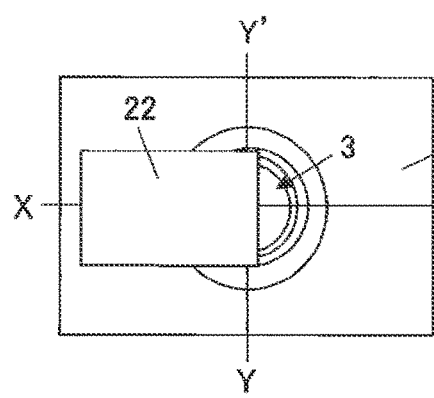
FIGS. 2BA to 2BC are a plan view and sectional structural views that illustrate a method for producing an SGT-including pillar-shaped semiconductor device according to the second embodiment.
Figure 2B:
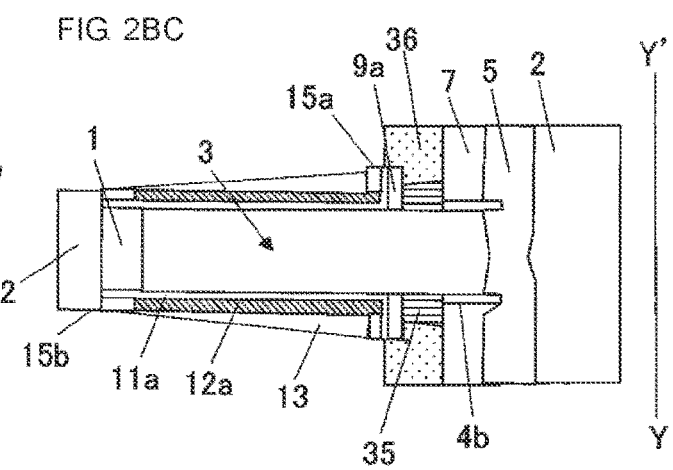
Figure 2B:
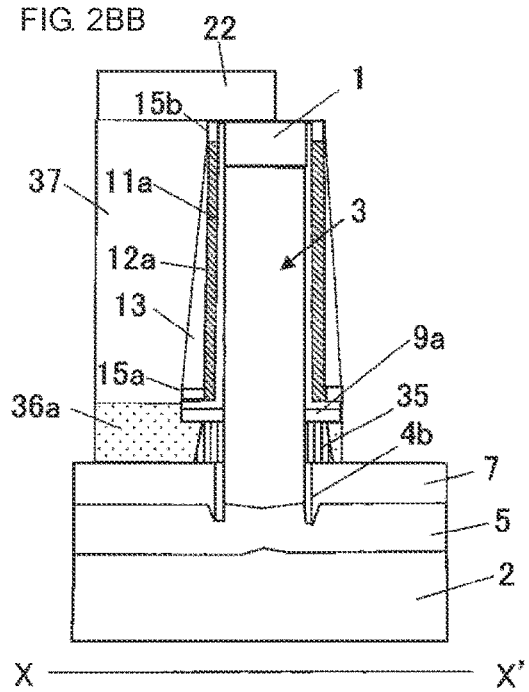
Figure 2C:
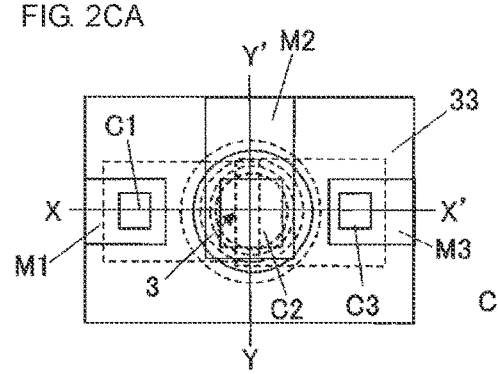
FIGS. 2CA to 2CC are a plan view and sectional structural views that illustrate a method for producing an SGT-including pillar-shaped semiconductor device according to the second embodiment.
Figure 2C:
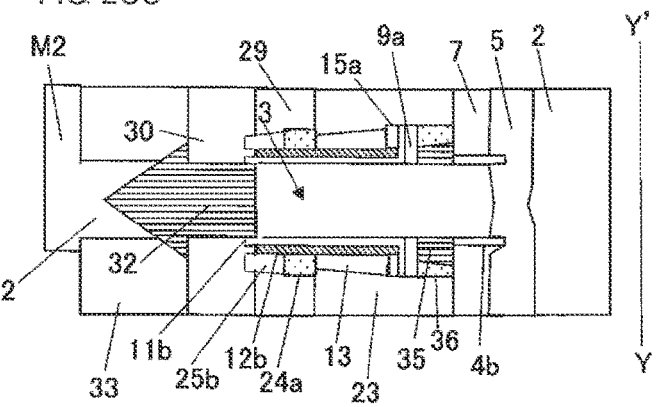
Figure 2C:
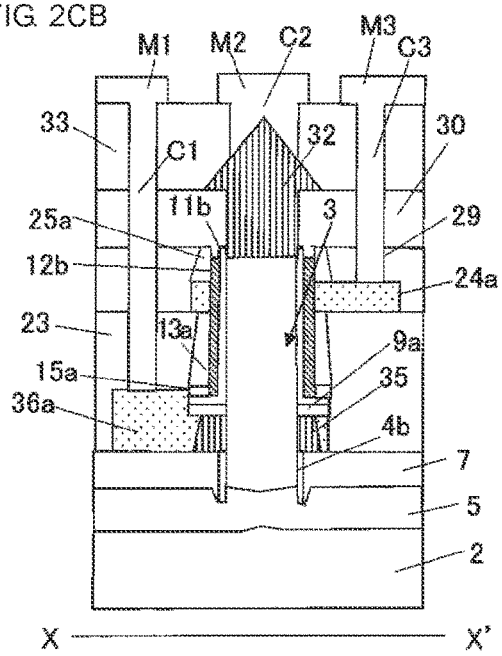

Subsequently, as illustrated in FIGS. 2BA to 2BC, the entire structure is covered with a SiO$_2$ layer (not shown). The SiO$_2$ layer is polished by a CMP method such that the level of the upper surface is lowered to the level of the upper surface of the mask material layer 1. Subsequently, in plan view, a resist layer 22 is formed so as to partially overlap the Si pillar 3. Subsequently, the SiO$_2$ layer and the W layer 36 are etched through, as masks, the SiN/SiO$_2$ layer 13, the mask material layer 1, and the resist layer 22, to thereby form a SiO$_2$ layer 37 and a W layer 36a. Subsequently, the resist layer 22 is removed. In this case, the W layer 36a is formed so as to surround the whole periphery of the P$^+$ layer 35 in plan view.

Subsequently, the same steps as in FIG. 1KA to FIG. 1PC are performed to thereby form an SGT illustrated in FIGS. 2CA to 2CC.

The SGT-including pillar-shaped semiconductor device according to this embodiment provides the following advantages.

1. In the first embodiment, the W layer 20a is in contact with, in plan view, a portion of the outer periphery of the P$^+$ layer 18. The W layer 20a does not surround the whole periphery of the P$^+$ layer 18. By contrast, in this embodiment, the W layer 36a is formed so as to surround, with a constant width in plan view, the whole periphery of the P$^+$ layer 35. The W layer 36a is thus surrounds, with a constant width, the whole periphery of the P$^+$ layer 35, to thereby achieve a reduction in the connection resistance between the P$^+$ layer 35 and the W layer 36a. This enables a further increase in the speed of the SGT circuit.

2. In this embodiment, a portion of the W layer 36 surrounding the Si pillar 3 in plan view is etched off through the SiN/SiO$_2$ layer 13 serving as a mask. The SiN/SiO$_2$ layer 13 is formed, with respect to the Si pillar 3, in a self-alignment manner that does not cause mask misalignment in lithography. Thus, the W layer 36a surrounding the whole periphery of the P$^+$ layer 35 in plan view can be formed with high accuracy so as to have a small area. This enables a high-density SGT circuit.

Third Embodiment

Hereinafter, a method for producing an SGT-including pillar-shaped semiconductor device according to a third embodiment of the present invention will be described with reference to FIG. 3AA to FIG. 3IC. Among FIG. 3AA to FIG. 3IC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A.

Figure 3A:
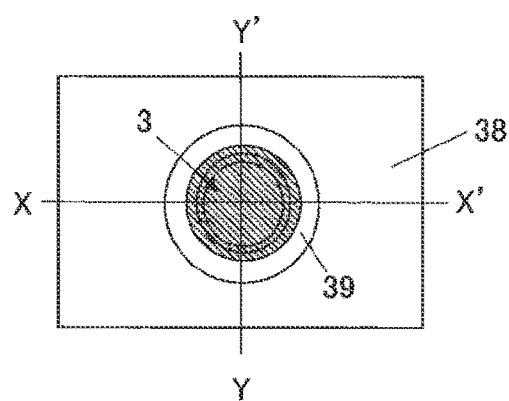
FIGS. 3AA to 3AC are a plan view and sectional structural views that illustrate a method for producing an SGT-including pillar-shaped semiconductor device according to a third embodiment of the present invention.
Figure 3A:
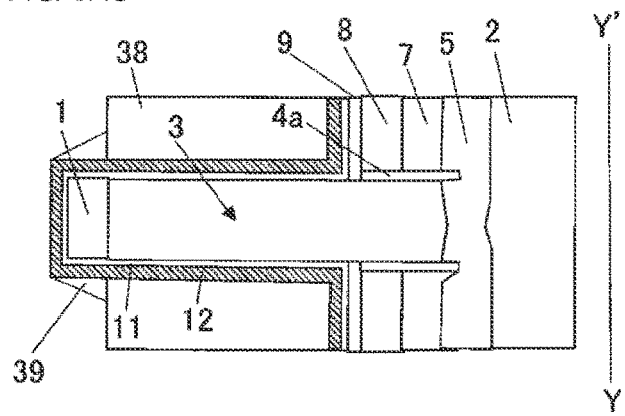
Figure 3A:
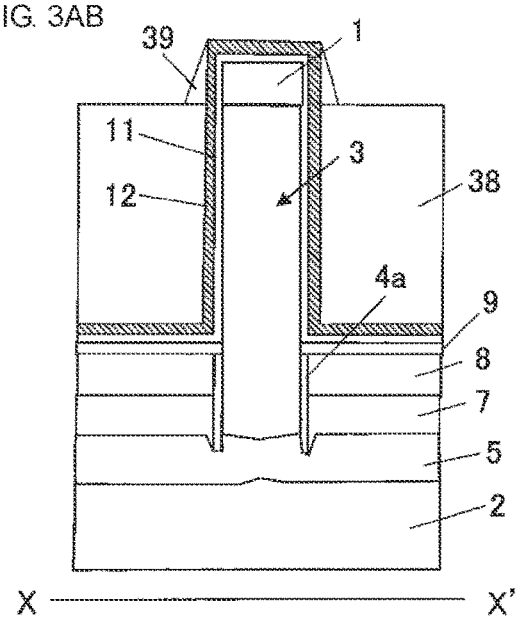

The steps as in FIG. 1AA to FIG. 1EC prior to formation of the SiN/SiO$_2$ layer 13 are performed prior to the step illustrated in FIGS. 3AA to 3AC. Subsequently, the entire structure is covered with a SiO$_2$ layer (not shown). The SiO$_2$ layer is polished by a CMP method such that the level of the upper surface is lowered to the level of the upper surface of the mask material layer 1. Subsequently, an etch back method is performed to etch the SiO$_2$ layer, to thereby form a SiO$_2$ layer 38. The upper surface of this SiO$_2$ layer 38 is desirably located (in the perpendicular direction) at the level of the lower end of the mask material layer 1. Subsequently, a SiN/SiO$_2$ layer 39 is formed on the SiO$_2$ layer 38 so as to surround the side surface of the top portion of the Si pillar 3 by the same method as in the formation of the SiN/SiO$_2$ layer 13.

Figure 3B:
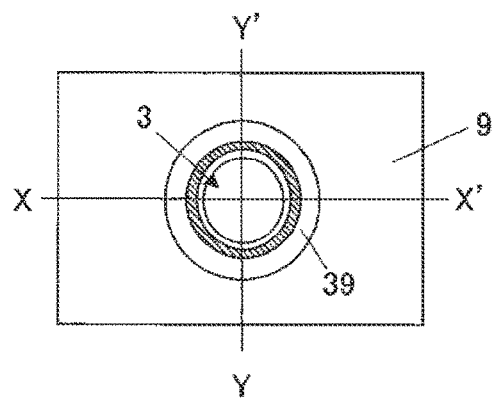
FIGS. 3BA to 3BC are a plan view and sectional structural views that illustrate a method for producing an SGT-including pillar-shaped semiconductor device according to a third embodiment of the present invention.
Figure 3B:
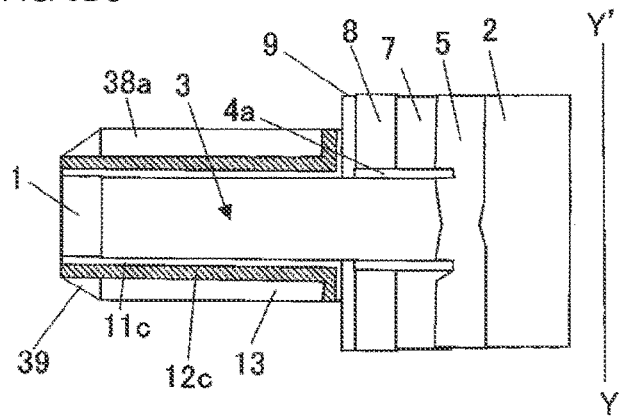
Figure 3B:
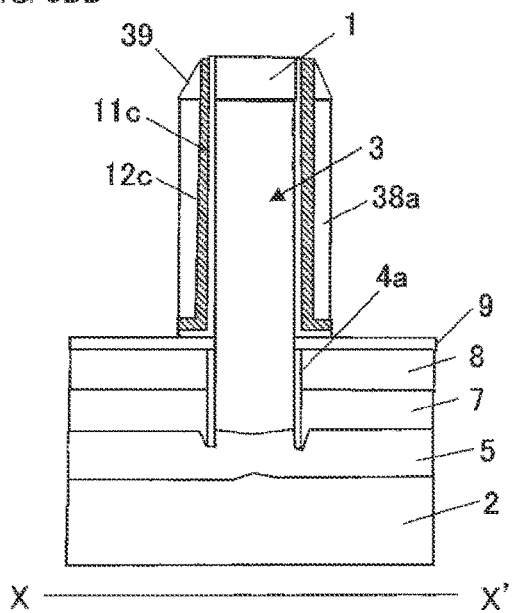

Subsequently, as illustrated in FIGS. 3BA to 3BC, the SiO$_2$ layer 38, the TiN layer 12, and the HfO$_2$ layer 11 are etched through the SiN/SiO$_2$ layer 39 serving as a mask, to thereby form a SiO$_2$ layer 38a, a TiN layer 12c, and a HfO$_2$ layer 11c surrounding the Si pillar 3.

Figure 3C:
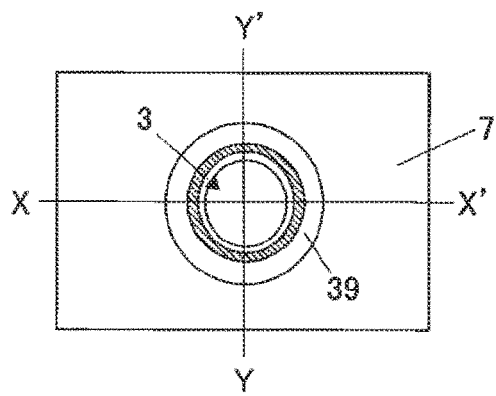
FIGS. 3CA to 3CC are a plan view and sectional structural views that illustrate a method for producing an SGT-including pillar-shaped semiconductor device according to a third embodiment of the present invention.
Figure 3C:
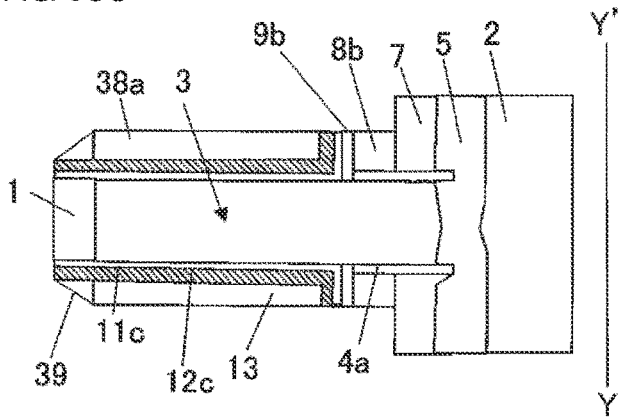
Figure 3C:
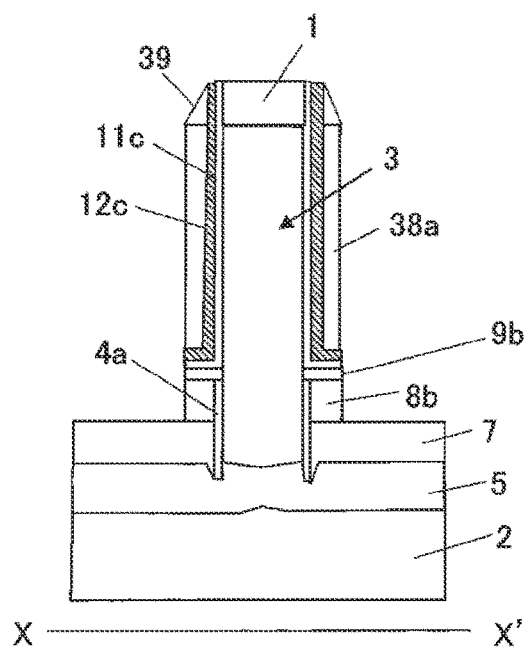

Subsequently, as illustrated in FIGS. 3CA to 3CC, the SiN layer 9 and the SiO$_2$ layer 8 are etched through the SiN/SiO$_2$ layer 39 serving as a mask, to form a SiN layer 9b and a SiO$_2$ layer 8b surrounding the Si pillar 3.

Figure 3D:
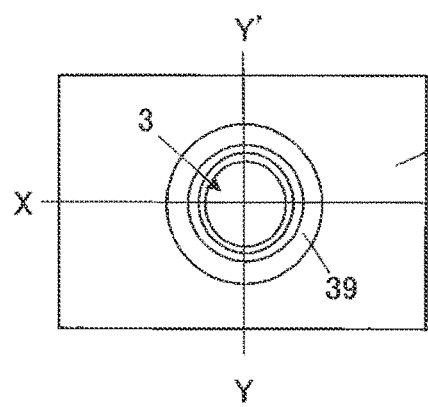
FIGS. 3DA to 3DC are a plan view and sectional structural views that illustrate a method for producing an SGT-including pillar-shaped semiconductor device according to a third embodiment of the present invention.
Figure 3D:
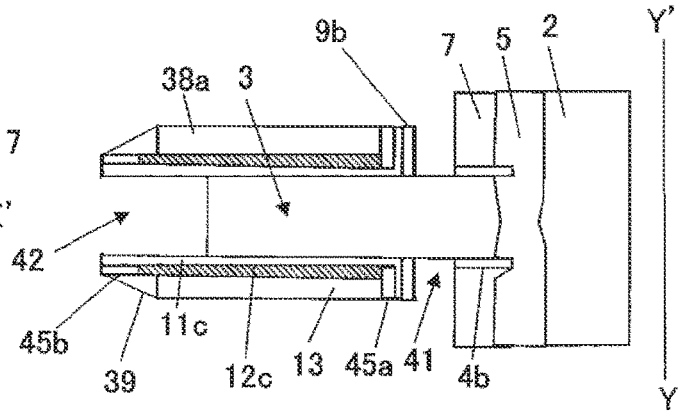
Figure 3D:
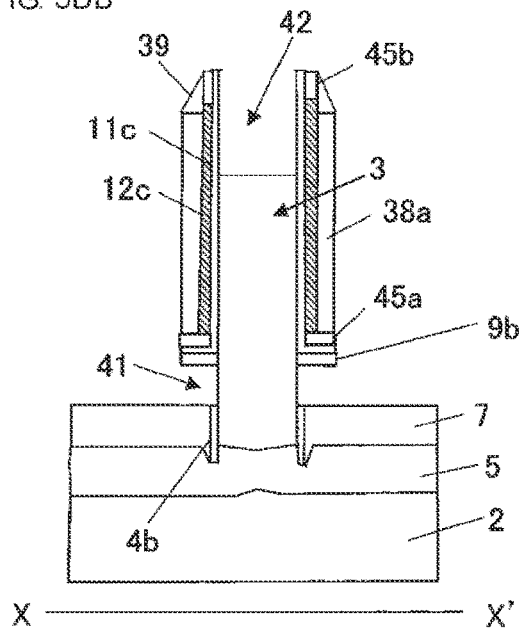

Subsequently, as illustrated in FIGS. 3DA to 3DC, the upper and lower exposed portions of the TiN layer 12c are oxidized to form TiNO layers 45a and 45b. Subsequently, the mask material layer 1 is removed. Subsequently, the top portion of the Si pillar 3 is etched to form a recessed portion 42. Subsequently, the SiO$_2$ layer 8b and the SiO$_2$ layer/SiN layer 4a located on the side surface of the bottom portion of the Si pillar 3 are etched off to expose the side surface of the bottom portion of the Si pillar 3. Thus, an opening portion 41 is formed.

Figure 3E:
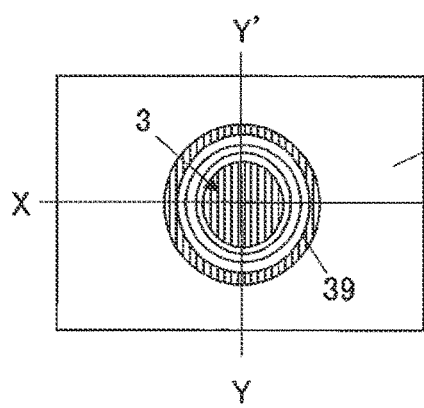
FIGS. 3EA to 3EC are a plan view and sectional structural views that illustrate a method for producing an SGT-including pillar-shaped semiconductor device according to a third embodiment of the present invention.
Figure 3E:
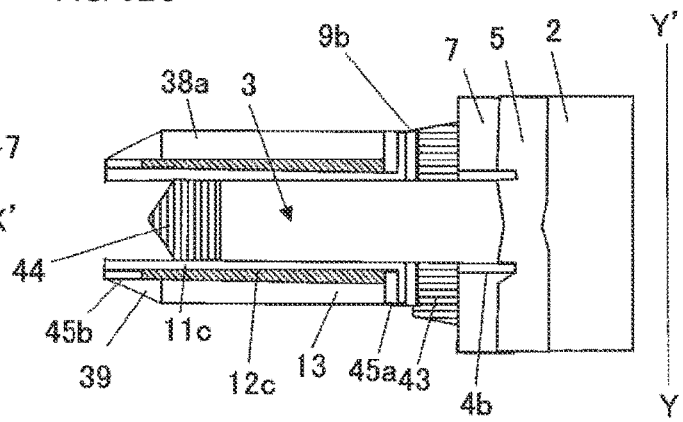
Figure 3E:
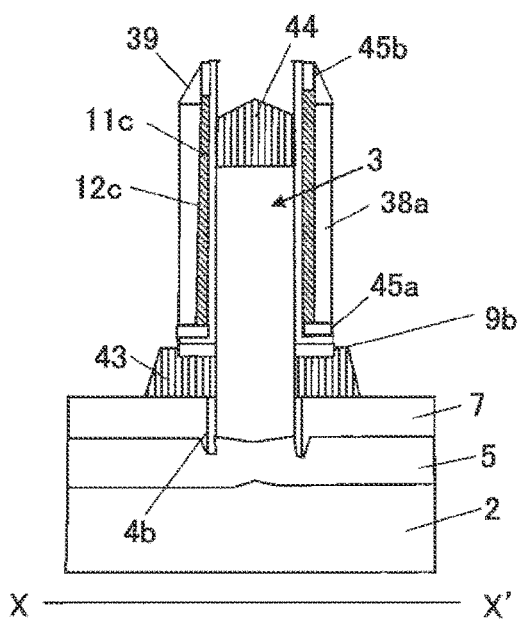

Subsequently, as illustrated in FIGS. 3EA to 3EC, a selective epitaxial crystal growth method is performed to form P$^+$ layers 43 and 44 in the opening portion 41 of the bottom portion of and the recessed portion 42 of the top portion of the Si pillar 3 so as to be in contact with the Si pillar 3 and contain an acceptor impurity at a high concentration.

Figure 3F:
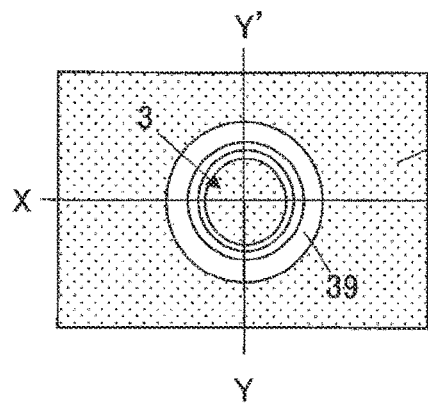
FIGS. 3FA to 3FC are a plan view and sectional structural views that illustrate a method for producing an SGT-including pillar-shaped semiconductor device according to a third embodiment of the present invention.
Figure 3F:
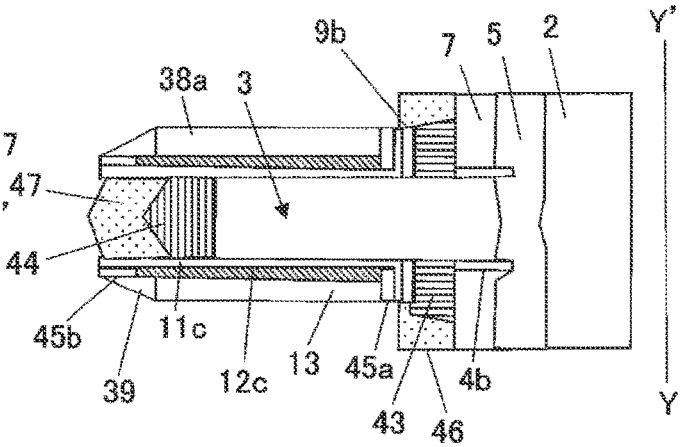
Figure 3F:
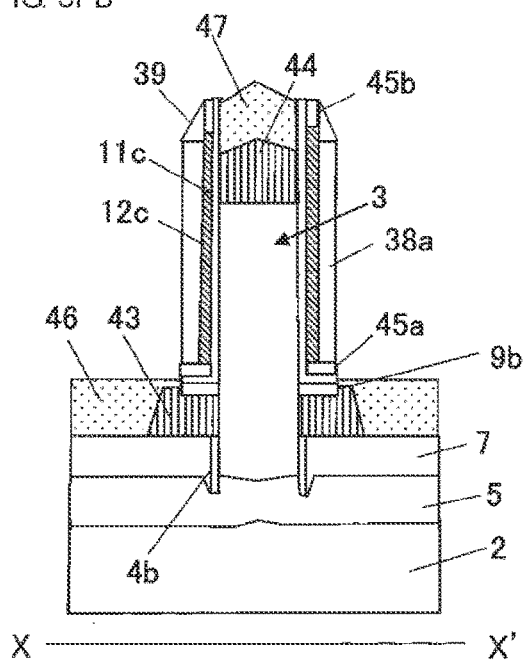

Subsequently, as illustrated in FIGS. 3FA to 3FC, a tantalum (Ta) sputtering deposition method is performed to form a Ta layer 47 on the P$^+$ layer 44 and a Ta layer 46 in contact with the P$^+$ layer 43 and on the SiN layer 7 disposed in an outer peripheral region around the Si pillar. This Ta sputtering deposition is performed such that the deposition acceleration voltage is adjusted so as not to cause deposition on the perpendicular side surface of the SiO$_2$ layer 38a (refer to C. Y. Ting, V. J. Vivalda, and H. G. Schaefer: "Study of planarized sputter-deposited SiO$_2$", J. Vac. Sci. Technol.

15(3), p.p. 1105-1112, May/June (1978)). Subsequently, the entire structure is subjected to mild Ta etching, to remove Ta adhering to the side surface of the SiN/SiO$_2$ layer 39.

Figure 3G:
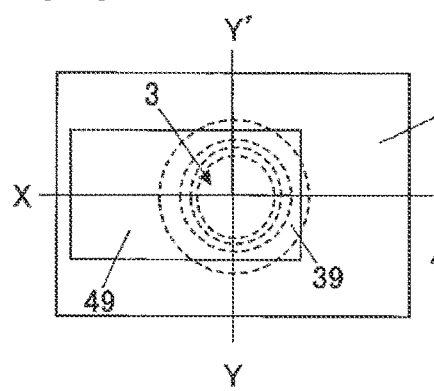
FIGS. 3GA to 3GC are a plan view and sectional structural views that illustrate a method for producing an SGT-including pillar-shaped semiconductor device according to a third embodiment of the present invention.
Figure 3G:
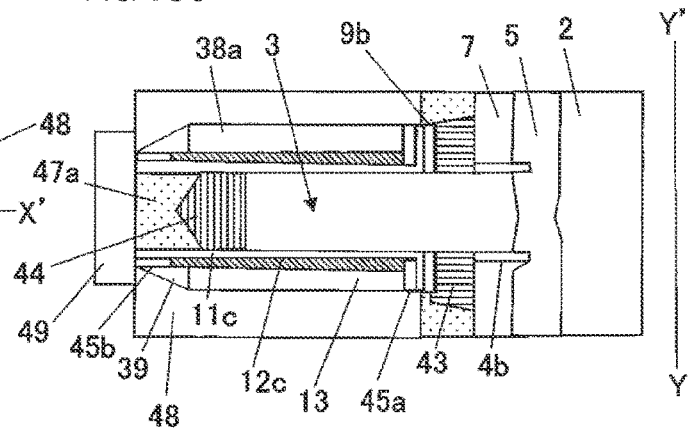
Figure 3G:
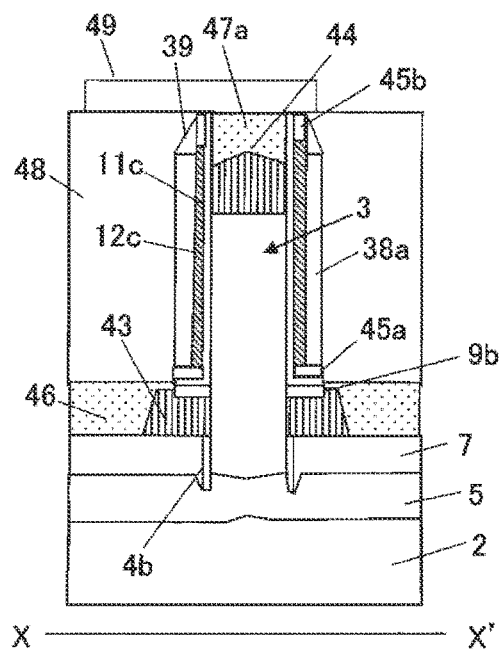

Subsequently, as illustrated in FIGS. 3GA to 3GC, the entire structure is covered with a SiO$_2$ layer (not shown), and the SiO$_2$ layer and the Ta layer 47 are polished by a CMP method such that the level of the upper surfaces of these layers is lowered to the level of the upper surface of the TiNO layer 45b. Thus, a SiO$_2$ layer 48 and a Ta layer 47a having a flat upper surface are formed. Subsequently, a resist layer 49 is formed so as to cover the Si pillar in plan view.

Figure 3H:
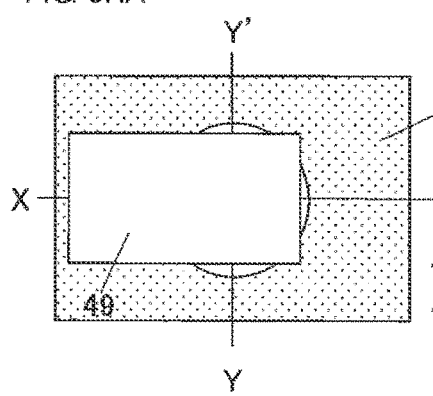
FIGS. 3HA to 3HC are a plan view and sectional structural views that illustrate a method for producing an SGT-including pillar-shaped semiconductor device according to a third embodiment of the present invention.
Figure 3H:
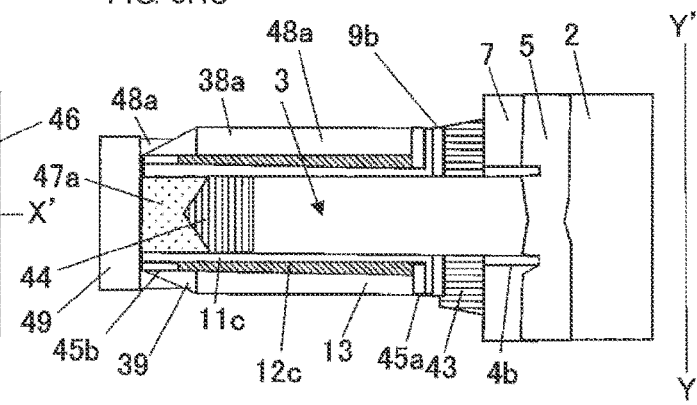
Figure 3H:
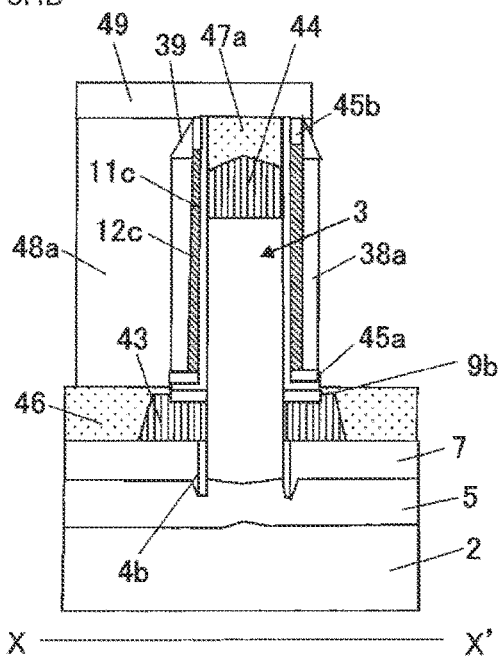
Figure 31A:
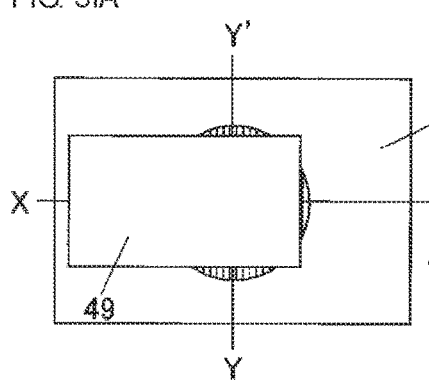
Figure 31C:
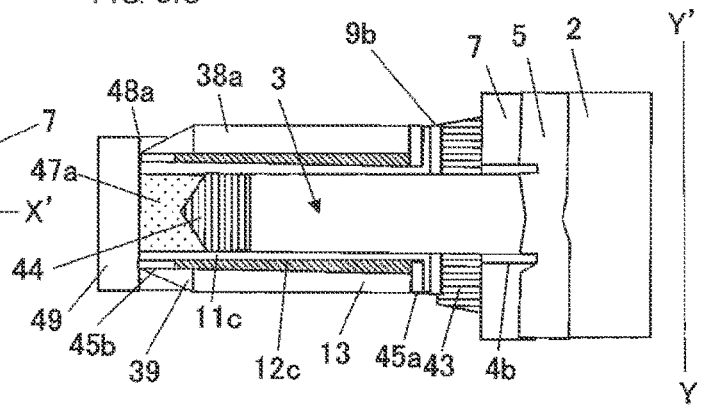
Figure 31B:
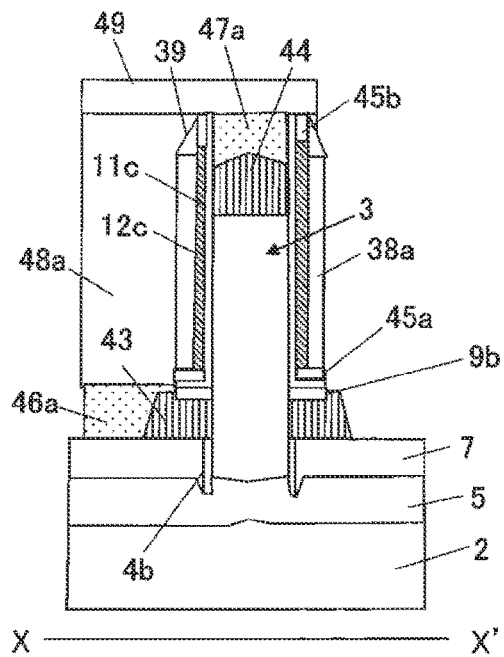

Subsequently, as illustrated in FIGS. 3HA to 3HC, the SiO$_2$ layer 48 is etched through, as masks, the resist layer 49 and the SiN/SiO$_2$ layer 39, to form a SiO$_2$ layer 48a.

Subsequently, as illustrated in FIGS. 3IA to 3IC, the Ta layer 46 is etched through, as masks, the resist layer 49 and the SiN/SiO$_2$ layer 39, to form a Ta layer 46a serving as a wiring conductor layer. Subsequently, the resist layer 49 is removed. Subsequently, the steps as in FIG. 1KA to FIG. 1PC are performed to form an SGT on the i-layer substrate 2. The Ta layer 47a serves as a connection conductor layer for the upper wiring conductor layer.

The SGT-including pillar-shaped semiconductor device according to this embodiment provides the following advantages.

1. In this embodiment, in plan view, the outer periphery of the P$^+$ layer 44 on the top portion of the Si pillar 3 and the Ta layer 47a serving as a connection conductor layer is the same as the outer periphery of the Si pillar 3 and is formed so as to extend upwardly. Since the Ta layer 47a has a low resistance, the connection region between the Ta layer 47a and the upper wiring conductor layer may be connected to, in plan view, only a portion of the Ta layer 47a. This provides a high-density SGT circuit.

2. In this embodiment, as illustrated in FIGS. 3EA to 3EC, the P$^+$ layers 43 and 44 are simultaneously formed by a selective epitaxial crystal growth method. This enables simplification of the steps of SGT production and the resultant method also provides an SGT having the same advantages as in the first embodiment.

Fourth Embodiment

Hereinafter, a method for producing an SGT-including pillar-shaped semiconductor device according to a fourth embodiment of the present invention will be described with reference to FIG. 4AA to FIG. 4EC. Among FIG. 4AA to FIG. 4EC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A.

Figure 4A:
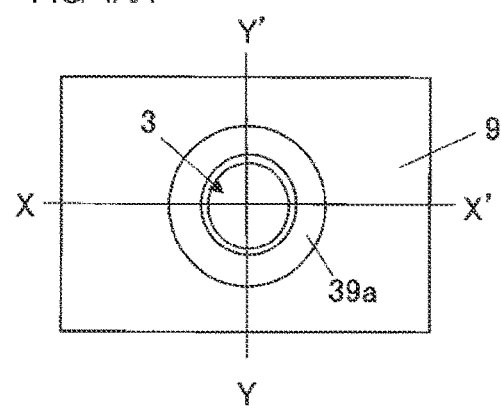
FIGS. 4AA to 4AC are a plan view and sectional structural views that illustrate a method for producing an SGT-including pillar-shaped semiconductor device according to a fourth embodiment of the present invention.
Figure 4A:
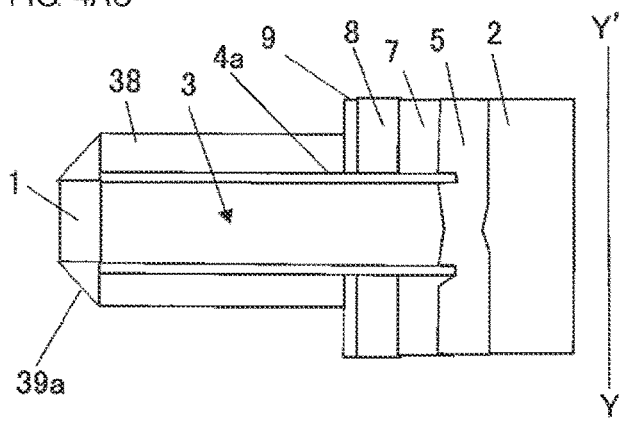
Figure 4A:
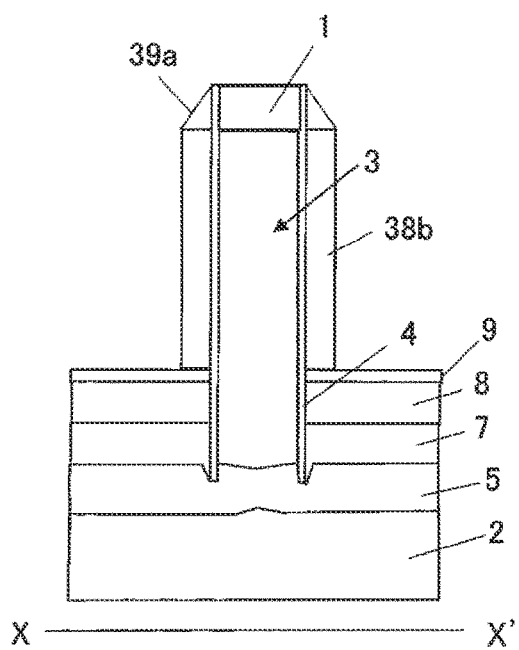

As illustrated in FIGS. 4AA to 4AC, without formation of the gate HfO$_2$ layer 11 and the gate TiN layer 12 in the steps illustrated in FIGS. 3AA to 3BC, the SiO$_2$ layer 38 is formed on an outer peripheral region around the SiO$_2$ layer/SiN layer 4 as in FIGS. 3AA to 3AC; and, similarly, a SiO$_2$ layer/SiN layer 39a is formed on the side surface of the mask material layer 1. Subsequently, the SiO$_2$ layer 38 is etched through, as masks, the SiO$_2$ layer/SiN layer 39a and the mask material layer 1 to form a SiO$_2$ layer 38b on the SiN layer 9 so as to surround the side surface of the SiO$_2$ layer/SiN layer 4.

Figure 4B:
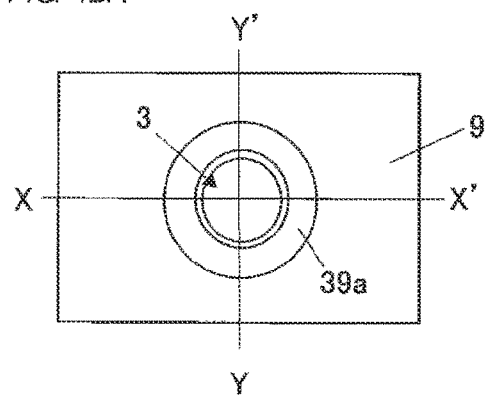
FIGS. 4BA to 4BC are a plan view and sectional structural views that illustrate a method for producing an SGT-including pillar-shaped semiconductor device according to a fourth embodiment of the present invention.
Figure 4B:
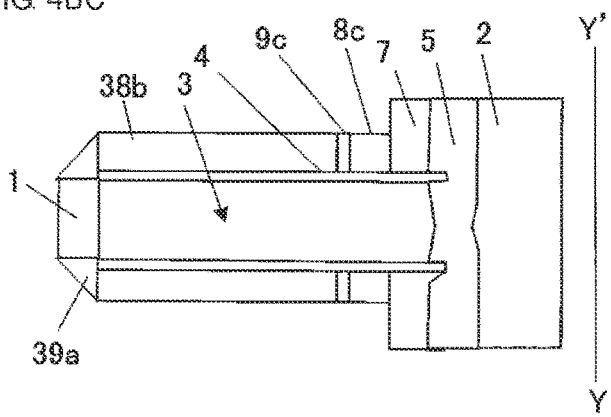
Figure 4B:
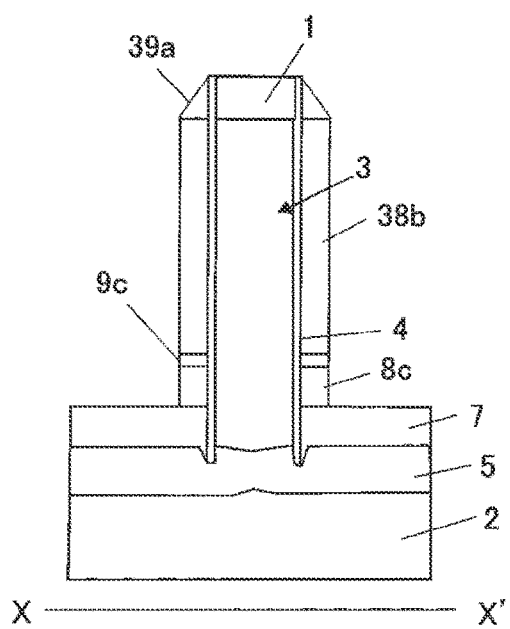

Subsequently, as illustrated in FIGS. 4BA to 4BC, the SiN layer 9 and the SiO$_2$ layer 8 are etched through, as masks, the SiO$_2$ layer/SiN layer 39a and the mask material layer 1, to form a SiN layer 9c and a SiO$_2$ layer 8c.

Figure 4C:
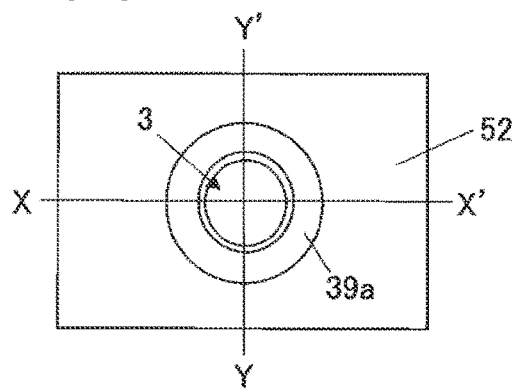
FIGS. 4CA to 4CC are a plan view and sectional structural views that illustrate a method for producing an SGT-including pillar-shaped semiconductor device according to a fourth embodiment of the present invention.
Figure 4C:
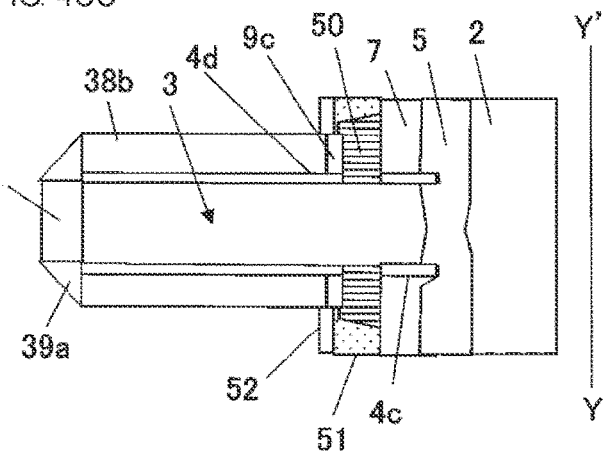
Figure 4C:
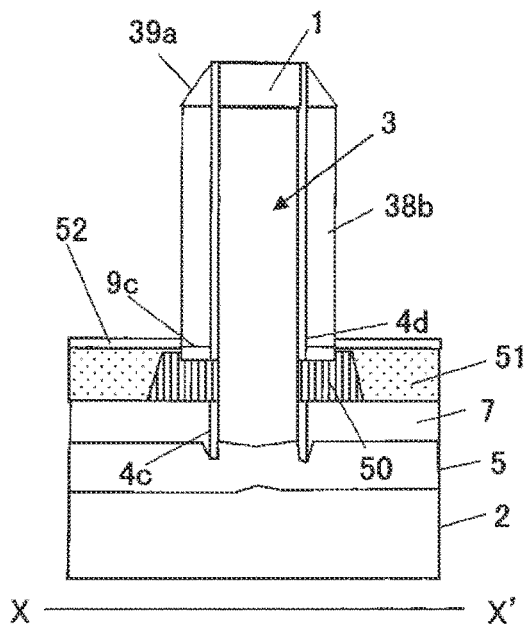

Subsequently, as illustrated in FIGS. 4CA to 4CC, the SiO$_2$ layer 8c is etched to expose the side surface of the bottom portion of the Si pillar 3. Subsequently, a selective epitaxial crystal growth method is performed to form a P$^+$ layer 50 containing an acceptor impurity at a high concentration. Subsequently, a W layer 51 is formed in contact with the P$^+$ layer and in an outer peripheral region around the P$^+$ layer. Subsequently, a SiN layer 52 is formed on the W layer 51 and in an outer peripheral region around the SiO$_2$ layer 38b.

Figure 4D:
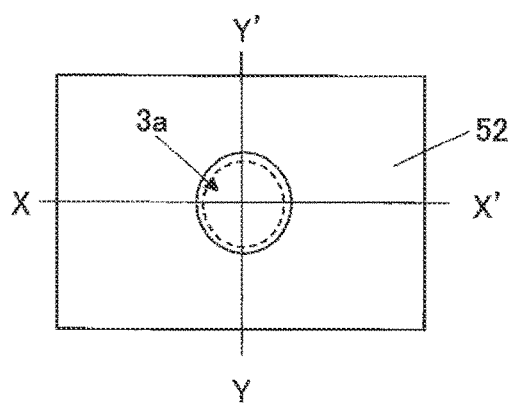
FIGS. 4DA to 4DC are a plan view and sectional structural views that illustrate a method for producing an SGT-including pillar-shaped semiconductor device according to a fourth embodiment of the present invention.
Figure 4D:
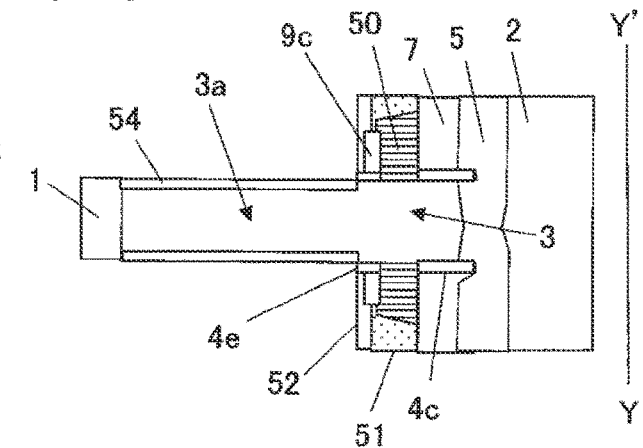
Figure 4D:
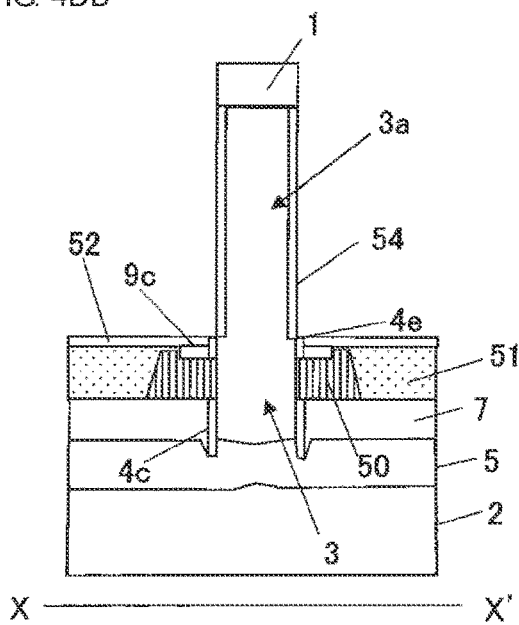

Subsequently, as illustrated in FIGS. 4DA to 4DC, the SiO$_2$ layer/SiN layer 39a, the SiO$_2$ layer 38b, and the SiN layer 4d are etched. This etching is performed such that a SiN layer 4e remains at the bottom portion of the SiN layer 4d. Subsequently, the side surface of the Si pillar 3 is oxidized to form a SiO$_2$ layer 54. In this case, in plan view, the SiO$_2$ layer 54 is formed so as to surround, with a constant width, a Si pillar 3a. Subsequently, the SiO$_2$ layer 54 is removed. This forms a Si pillar 3a having, in a region above the SiN layer 52 in the perpendicular direction, a smaller diameter than the Si pillar 3.

Figure 4E:
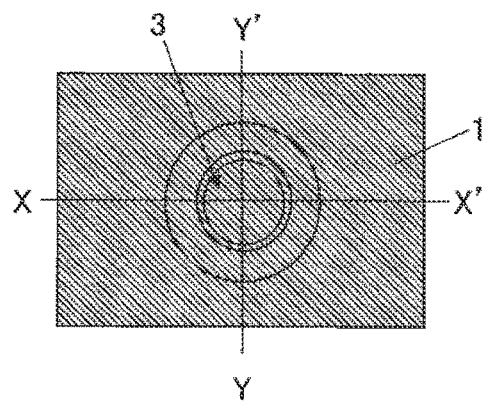
FIGS. 4EA to 4EC are a plan view and sectional structural views that illustrate a method for producing an SGT-including pillar-shaped semiconductor device according to a fourth embodiment of the present invention.
Figure 4E:
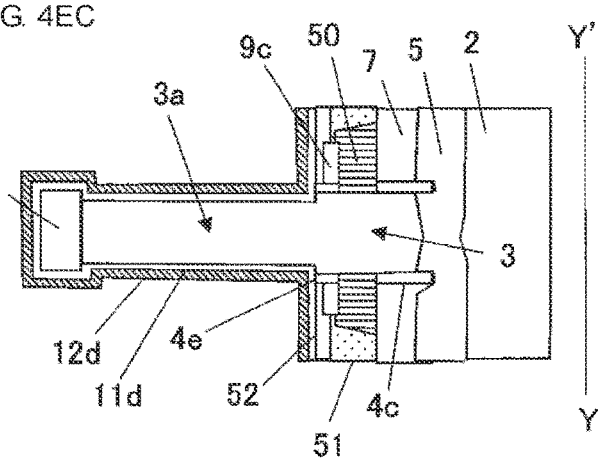
Figure 4E:
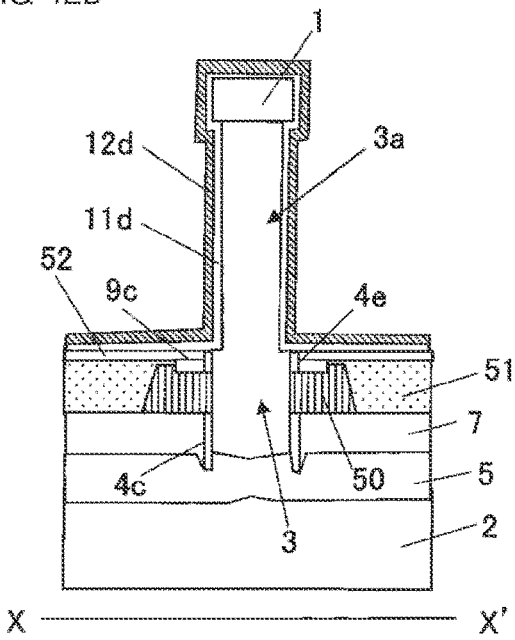

Subsequently, as illustrated in FIGS. 4EA to 4EC, on the entire structure, a gate HfO$_2$ layer 11d and a gate TiN layer 12d are formed by an ALD method. Subsequently, the gate HfO$_2$ layer 11d and the gate TiN layer 12d are patterned by the same method as in FIG. 1EA to FIG. 1FC. Subsequently, the W layer 51 is patterned by the same method as in FIG. 1IA to FIG. 1JC. Subsequently, the steps as in FIG. 1KA to FIG. 1PC are performed to thereby form an SGT on the i-layer substrate 2.

The SGT-including pillar-shaped semiconductor device according to this embodiment provides the following advantages.

1. In this embodiment, the P$^+$ layer 50 is formed in contact with the side surface of the Si pillar 3, which has, in plan view, a longer outer periphery than the Si pillar 3a. This achieves an increase in the area of the side surface of the Si pillar 3 through which current passes via the P$^+$ layer 50. In this case, the heating step up to the final step more desirably causes the acceptor impurity to diffuse from the P$^+$ layer 50 to a region near the boundary between the upper Si pillar 3a and the bottom Si pillar 3.

2. In this embodiment, the P$^+$ layer 50 is formed prior to formation of the gate HfO$_2$ layer 11d and the gate TiN layer 12d. In this case, unlike the first embodiment, the selective epitaxial crystal growth of the P$^+$ layer 50 can be performed without considering thermal damage on the gate HfO$_2$ layer 11d and the gate TiN layer 12d. This enables, in the selective epitaxial crystal growth process of the P$^+$ layer 50, an increase in the process margin, such as an increase in the epitaxial growth temperature for improving crystallinity.

Fifth Embodiment

Figure 5A:
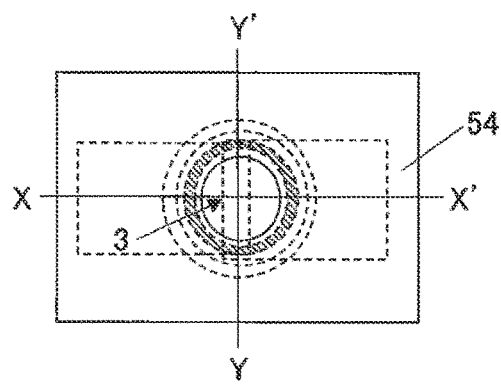
FIGS. 5AA to 5AC are a plan view and sectional structural views that illustrate a method for producing an SGT-including pillar-shaped semiconductor device according to a fifth embodiment of the present invention.
Figure 5A:
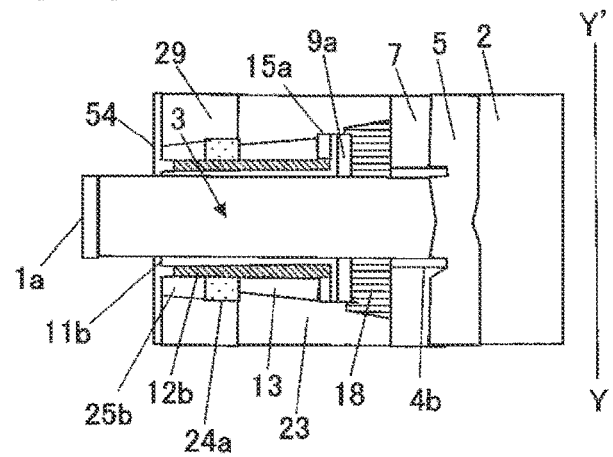
Figure 5A:
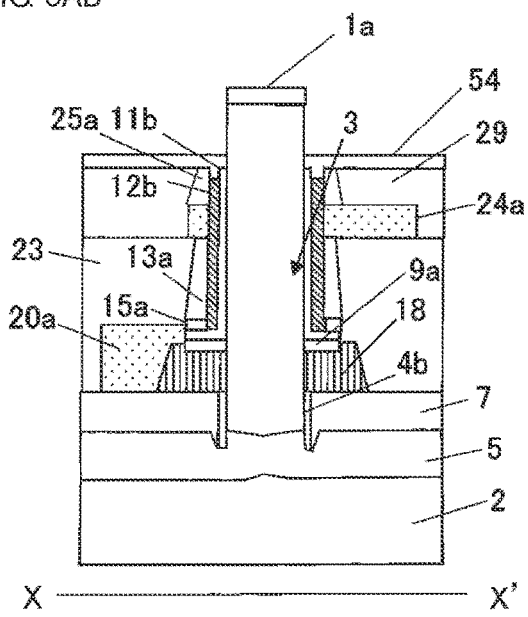

Hereinafter, a method for producing an SGT-including pillar-shaped semiconductor device according to a fifth embodiment of the present invention will be described with reference to FIG. 5AA to FIG. 5BC. Among FIG. 5AA to FIG. 5BC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A.

The steps in FIG. 1AA to FIG. 1MC are performed. In the steps, as illustrated in FIGS. 5AA to 5AC, the SiO$_2$ layer 1a on the top portion of the Si pillar 3 is left. Subsequently, a SiO$_2$ layer 54 is formed on the SiO$_2$ layer 29, the HfO$_2$ layer 1lb, the TiN layer 12b, and the SiN layer 25a, which surround the Si pillar 3. Thus, the side surface of the top portion of the Si pillar 3 is exposed.

Figure 5B:
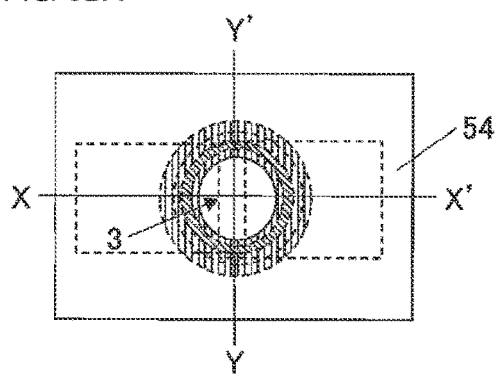
FIGS. 5BA to 5BC are a plan view and sectional structural views that illustrate a method for producing an SGT-including pillar-shaped semiconductor device according to a fifth embodiment of the present invention.
Figure 5B:
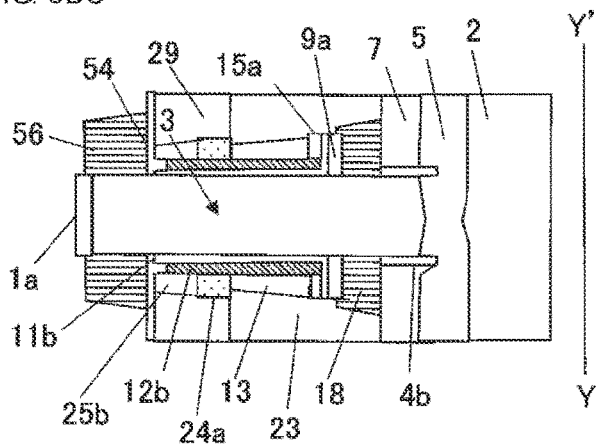
Figure 5B:
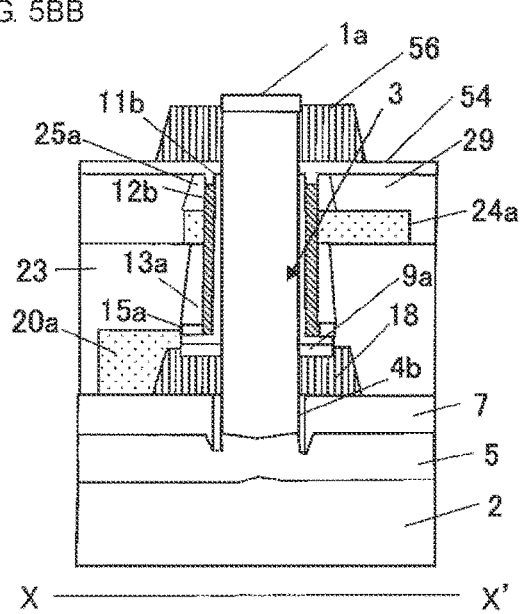

Subsequently, as illustrated in FIGS. 5BA to 5BC, a P$^+$ layer 56 containing an acceptor impurity is formed by a selective epitaxial crystal growth method. Subsequently, the step described with FIGS. 1PA to 1PC is performed to form an SGT on the i-layer substrate 2.

The SGT-including pillar-shaped semiconductor device according to this embodiment provides the following advantages.

1. In this embodiment, the upper and lower P$^+$ layers 18 and 56 are both formed so as to contain an acceptor impurity at a high concentration by a selective epitaxial crystal growth method. Thus, an SGT having low-resistance source and drain is formed.

2. This embodiment is applicable to formation of a semiconductor device in which a plurality of SGTs are formed in a single Si pillar. Thus, in a single Si pillar, a plurality of SGTs having low-resistance source and drain can be formed.

3. In the first embodiment, as illustrated in FIG. 1NA to FIG. 10C, the P$^+$ layer 32 is formed, by selective epitaxial crystal growth, upward from the upper surface of the Si pillar 3. In this case, when, with an increase in the density of the SGT circuit, the diameter of the Si pillar 3 decreases, the P$^+$ layer 32 having high crystallinity is difficult to form. By contrast, in this embodiment, the exposed top portion of the Si pillar 3 is provided so as to have a large height, to thereby provide, without causing a decrease in the degree of integration of the SGT circuit, a large contact area between the Si pillar 3 and the P$^+$ layer 56. Thus, a high-density SGT circuit having low-resistance source and drain can be formed.

Sixth Embodiment

Figure 6A:
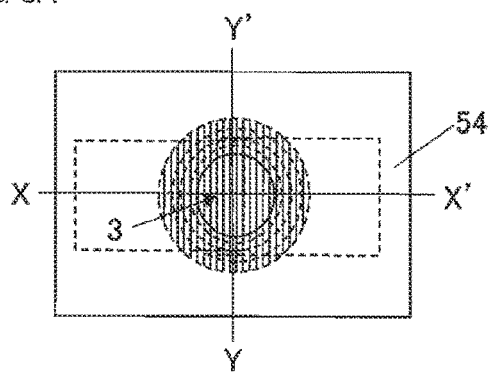
FIGS. 6A to 6C are a plan view and sectional structural views that illustrate a method for producing an SGT-including pillar-shaped semiconductor device according to a sixth embodiment of the present invention.
Figure 6C:
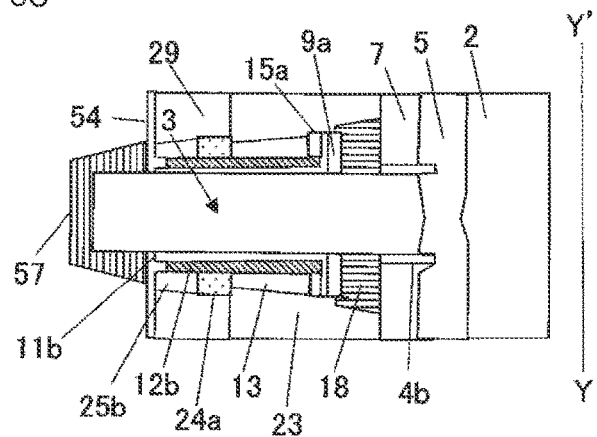
Figure 6B:
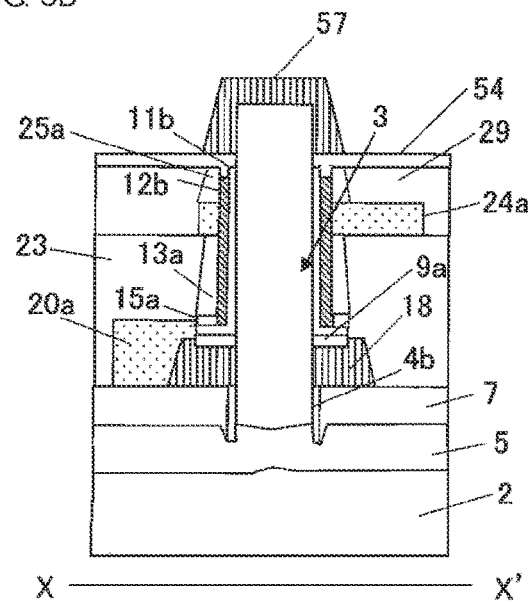
Figure 7:
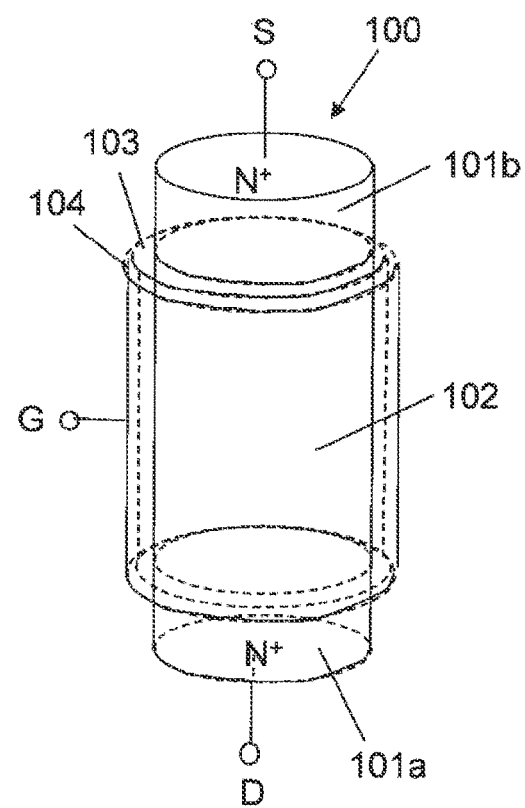
FIG. 7 is a schematic structural view of an existing SGT.

Hereinafter, a method for producing an SGT-including pillar-shaped semiconductor device according to a sixth embodiment of the present invention will be described with reference to FIGS. 6A to 6C. Among FIGS. 6A to 6C, the figure suffixed with A is a plan view; the figure suffixed with B is a sectional structural view taken along line X-X' in the figure suffixed with A; and the figure suffixed with C is a sectional structural view taken along line Y-Y' in the figure suffixed with A.

The steps in FIG. 1AA to FIG. 1MC are performed. In the steps, as illustrated in FIGS. 6B and 6C, the SiO$_2$ layer 1a on the top portion of the Si pillar 3 in FIGS. 5AB and 5AC is not left. Subsequently, as illustrated in FIGS. 6B and 6C, a P$^+$ layer 57 containing an acceptor impurity at a high concentration is formed by a selective epitaxial crystal growth method. In this case, before the selective epitaxial crystal growth, the side surface and the upper surface of the top portion of the Si pillar 3 are exposed. Thus, the P$^+$ layer 57 is formed so as to cover the whole top portion of the Si pillar 3. Subsequently, the step described with FIGS. 1PA to 1PC is performed. Thus, an SGT is formed on the i-layer substrate 2. Observation of a magnified view of the boundary between the P$^+$ layer 57 and the Si pillar 3 reveals, into the Si pillar 3, diffusion of the acceptor impurity of the P$^+$ layer 57 due to thermal history after formation of the P$^+$ layer 57. With a decrease in the diameter (in plan view) of the Si pillar 3, the acceptor impurity from the P$^+$ layer 57 is diffused, in plan view, throughout the Si pillar 3. Even in this case, the sharp-change impurity distribution in the perpendicular direction within the Si pillar 3 is maintained. In this case, the end of the acceptor impurity region in the perpendicular direction within the Si pillar is desirably positioned near the upper end of the gate TiN layer 12b.

The SGT-including pillar-shaped semiconductor device according to this embodiment provides the following advantages.

1. In this embodiment, the upper and lower P$^+$ layers 18 and 57 are both formed so as to contain an acceptor impurity at a high concentration by a selective epitaxial crystal growth method. Thus, as in the fifth embodiment, an SGT having low-resistance source and drain is formed.

2. This embodiment is applicable to formation of the uppermost SGT in formation of a semiconductor device in which a plurality of SGTs are formed in a single Si pillar. Thus, in a single Si pillar, a plurality of SGTs having low-resistance source and drain can be formed.

3. In this embodiment, as in the fifth embodiment, the exposed top portion of the Si pillar 3 is provided so as to have a large height, to thereby provide, without causing a decrease in the degree of integration of the SGT circuit, a large contact area between the Si pillar 3 and the P$^+$ layer 57. Thus, a high-density SGT circuit having low-resistance source and drain can be formed.

Incidentally, embodiments according to the present invention have been described with examples of single-SGT transistors; however, the present invention is also applicable to formation of plural-SGT-including circuits.

Embodiments according to the present invention have been described with the case of formation of a single SGT in the single semiconductor pillar 3; however, the present invention is also applicable to formation of circuits in which two or more SGTs are formed in a single semiconductor pillar 3.

In the first embodiment, as illustrated in FIGS. 1AA to 1AC, the mask material layer 1 constituted by the SiO$_2$ layer/Al$_2$O$_3$ layer/SiO$_2$ layer is used as an etching mask. As long as the intended result is achieved, the material layer may be constituted by a single layer or another combination of plural layers. The same applies to other embodiments according to the present invention.

In the first embodiment, as illustrated in FIGS. 1AA to 1AC, the mask material layer 1 constituted by the SiO$_2$ layer/Al$_2$O$_3$ layer/SiO$_2$ layer is partially or entirely left on the top portion of the Si pillar 3, until the step illustrated in FIGS. 1LA to 1LC, as a mask against the etching processes. As long as the intended result is achieved, the material layer may be constituted by a single layer or another combination of plural layers. The same applies to other embodiments according to the present invention.

In the first embodiment, as illustrated in FIGS. 1FA to 1FC, the mask material layer 1 and the SiN/SiO$_2$ layer 13 are used as masks for etching the TiN layer 12, the HfO$_2$ layer 11, the SiN layer 9, and the SiO$_2$ layer 8, to form the TiN layer 12a, the HfO$_2$ layer 11a, the SiN layer 9a, and the SiO$_2$ layer 8a. Instead of the SiN/SiO$_2$ layer 13, another material layer may be used that is constituted by a single layer or another combination of plural layers as long as it serves as the mask for etching the TiN layer 12, the HfO$_2$ layer 11, the SiN layer 9, and the SiO$_2$ layer 8. The same applies to the SiN/SiO$_2$ layer 25 in FIGS. 1KB and 1KC and, in the third embodiment, the SiN/SiO$_2$ layer 39 in FIGS. 3AA to 3AC. The same applies to other embodiments according to the present invention.

In the first embodiment, the Si pillar 3 is formed on the i-layer substrate 2, to form an SGT. Alternatively, the i-layer substrate 2 may be replaced by an SOI (Silicon on Insulator) substrate. The i-layer substrate 2 may have a well structure. The same applies to other embodiments according to the present invention.

In the first embodiment, as illustrated in FIGS. 1CA to 1CC, while the top portion of the Si pillar 3 is covered with the mask material layer 1 and the side surface of the Si pillar 3 is covered with the SiO$_2$/SiN layer 4, a thermal oxidation method is performed to form the SiO$_2$ layer 5 in the bottom portion of the Si pillar 3 and in the upper surface of the i-layer substrate 2. The SiO$_2$ layer 5 may be formed in the following manner: for example, an FCVD method and a CMP method are performed such that the entire structure is covered with an FCVD-SiO$_2$ layer and the level of the upper surface of the layer is lowered to the level of the upper surface of the mask material layer; and subsequently thermal oxidation is performed. In this case, oxygen (O) passes through the FCVD-SiO$_2$ layer, and oxidizes the bottom portion of the Si pillar 3 and the upper surface of the i-layer substrate 2, to thereby form the SiO$_2$ layer 5. Alternatively, another method may be performed to form the SiO$_2$ layer 5. The same applies to other embodiments according to the present invention.

In the first embodiment, as illustrated in FIGS. 1GA to 1GC, the exposed TiN layer 12a in the top portion and bottom portion of the TiN layer 12a is oxidized to form the TiNO layers 15a and 15b serving as insulating layers. Alternatively, for example, in FIGS. 1FB and 1FC, while the SiO$_2$ layer 8a is left, the exposed TiN layer 12a is etched to form recessed portions; subsequently, an ALD method is performed to fill the recessed portions and cover the entire structure with a SiN layer; with the SiN layers in the recessed portions are left, the SiN layer covering the other entire structure is etched off. As a result, insulating layers that are SiN layers can be formed in the top portion and the bottom portion of the TiN layer 12a. In this way, a method other than oxidation may be employed to form insulating layers in the top portion and bottom portion of the TiN layer 12a. The same applies to other embodiments according to the present invention.

In the first embodiment, as illustrated in FIGS. 1DA to 1DC, the SiN layer 7, the SiO$_2$ layer 8, and the SiN layer 9 are formed around the Si pillar 3 and on the SiO$_2$ layer 5. Subsequently, as illustrated in FIG. 1FA to FIG. 1GC, the mask material layer 1 and the SiN/SiO$_2$ layer 13 are used as masks for etching the TiN layer 12, the HfO$_2$ layer 11, the SiN layer 9, and the SiO$_2$ layer 8, to form the TiN layer 12a, the HfO$_2$ layer 11a, the SiN layer 9a, and the SiO$_2$ layer 8a. Subsequently, the exposed TiN layer 12a is oxidized, to form the TiNO layers 15a and 15b. Subsequently, the SiO$_2$ layer 8a is etched to form the space 16 through which the side surface of the bottom portion of the Si pillar 3 is exposed. In this case, the materials of the mask material layer 1, the SiN/SiO$_2$ layer 13, the TiN layer 12a, the HfO$_2$ layer 11a, the SiN layer 9, and the SiO$_2$ layer 8 and the etching methods for these layers may be freely selected as long as the side surface of the bottom portion of the Si pillar 3 is exposed. The same applies to other embodiments according to the present invention.

In the first embodiment, as illustrated in FIGS. 1HA to 1HC, the P$^+$ layer 18 is formed by a selective epitaxial crystal growth method. The P$^+$ layer 18 may be formed by, instead of a CVD method, for example, another method of achieving selective epitaxial crystal growth, such as molecular beam deposition, an ALD method, or a liquid phase epitaxial method. The same applies to formation of the P$^+$ layer 32. The same applies to other embodiments according to the present invention.

In the first embodiment, as illustrated in FIGS. 1HA to 1HC, the P$^+$ layer 18 containing an acceptor impurity at a high concentration and constituted by a single layer or a plurality of layers is formed by a selective epitaxial crystal growth method so as to be in contact with the exposed side surface (in the opening portion 16) of the Si pillar 3. The Si pillar 3, which has a circular shape in plan view, enables a reduction in the predominance of plane orientations in the side surface of the Si pillar 3. Thus, the P$^+$ layer 18 surrounding the Si pillar 3 is formed with a substantially constant width in plan view. From another viewpoint, since the side surface of the Si pillar 3 has various plane orientations, microscopically the outer periphery of the P$^+$ layer 18 has irregularities in plan view due to the plane orientations. However, macroscopically, the P$^+$ layer 18 has a constant width. The same applies to other embodiments according to the present invention.

In the first embodiment, as illustrated in FIGS. 1JA to 1JC, the mask material layer 1, the SiN/SiO$_2$ layer 13, and the resist layer 22 are used as masks for etching of the SiO$_2$ layer 21 and the W layer 20. As a result, the W layer 20a is formed below the resist layer 22 and in contact with the P$^+$ layer 18, which has, in plan view, a ring shape surrounding the side surface of the Si pillar 3. The resist layer 22 may be constituted by, as long as the intended result of the etching is achieved, a resist material layer or a single layer or plural layers selected from organic layers and inorganic layers. The resist layer 22 may be etched in its upper layer portion during etching of the SiO$_2$ layer 21 and the W layer 20 as long as the resist layer 22 serves as a mask layer until the end of the etching. Alternatively, when the SiO$_2$ layer 21a serves as a mask during formation of the W layer 20a, the resist layer 22 may be removed at the final stage of etching. The same applies to the resist layer 27. The same applies to other embodiments according to the present invention.

In the first embodiment, as illustrated in FIGS. 1PA to 1PC, the P$^+$ layer 32 is formed such that the lower end in the perpendicular direction is located at the level of the upper end of the TiN layer 12b serving as a gate conductor layer. The bottom portion of the P$^+$ layer 32 is desirably located at the level of the upper end of the gate TiN layer 12b. The level of the bottom portion of the P$^+$ layer 32 relative to the level of the upper end of the gate TiN layer 12b may be, as long as it does not adversely affect the operation of the SGT, slightly higher or slightly lower than the upper end of the gate TiN layer 12b. The level of the lower end (in the perpendicular direction) of the P$^+$ layer 32 may be higher than or lower than the level of the upper end of the gate insulating layer 11b. The same applies to other embodiments according to the present invention.

In the first embodiment, the wiring conductor layer portion connected to the P$^+$ layer 18 is formed as the W layer 20a; alternatively, the portion may be formed as another material layer constituted by a single layer or plural layers, such as metal or alloy layers. The same applies to, in the third embodiment, the Ta layer 46 connected to the P$^+$ layer 43. The same applies to other embodiments according to the present invention.

The embodiments according to the present invention have been described with the Si pillars 3 having a circular shape in plan view. However, the present invention is similarly applicable to cases where the Si pillar 3 has a rectangular shape or an elliptical shape in plan view.

In the first embodiment, as illustrated in FIGS. 1PB and 1PC, the P⁺ layers 18 and 32 are formed on the side surface of the bottom portion of and on the top portion of the Si pillar 3. Observation of magnified views of the boundaries between the Si pillar 3 and the P⁺ layers 18 and 32 reveals that the acceptor impurity in the P⁺ layers 18 and 32 is diffused by a post-formation heating step into the Si pillar 3. In this case, compared with ion implantation and a solid-phase diffusion method, the sharp-change distributions of the acceptor impurity are maintained at the boundaries between the Si pillar 3 and the P⁺ layers 18 and 32, which enables a reduction in the junction resistance. When the Si pillar 3 has an even smaller diameter in plan view, the acceptor impurity from the P⁺ layer 18 formed by a selective epitaxial crystal growth method is diffused, in plan view, throughout the Si pillar 3. Even in this case, a sharp-change impurity distribution is provided within the Si pillar 3 in the perpendicular direction, compared with ion implantation and a solid-phase diffusion method. This is because the necessary P⁺ layer 18 is first formed on the outer periphery of the Si pillar 3; by contrast, ion implantation requires high-temperature activation treatment for impurity ions, and solid-phase diffusion requires heat treatment for thermally diffusing impurity for forming a P⁺ region within the Si pillar 3. Incidentally, in order to provide the sharp-change impurity distribution, the heating step after formation of the P⁺ layers 18 and 32 is desirably performed at a lower temperature and for a shorter time. The same applies to the fifth embodiment and the sixth embodiment. The same applies to other embodiments according to the present invention.

Similarly, in the first embodiment, when the Si pillar 3 has an even smaller diameter in plan view, the acceptor impurity from the P⁺ layer 18 formed by a selective epitaxial crystal growth method is diffused, in plan view, throughout the Si pillar 3. In this case, within the Si pillar 3, the upper end of the P⁺ layer 18 is located above, in the perpendicular direction, the level of the lower end of the SiN layer 9a. The upper end of the impurity region connected to the P⁺ layer 18 within the Si pillar 3 is desirably located at the level of the lower end of the gate TiN layer 12b. This level of the lower end encompasses levels slightly higher or slightly lower than the lower end of the gate TiN layer 12b as long as it does not adversely affect the operation of the SGT. The same applies to other embodiments according to the present invention.

In the fourth embodiment, it is stated that the heating step up to the final step more desirably causes the acceptor impurity to diffuse from the P⁺ layer 50 to a region near the boundary between the upper Si pillar 3a and the bottom Si pillar 3. Also in this case, the upper end of the acceptor impurity diffusion region extending from the P⁺ layer 50 may be located at the level of the upper end of the bottom Si pillar 3 as long as it does not adversely affect the operation of the SGT. This level of the upper end of the bottom Si pillar 3 encompasses levels slightly higher or slightly lower than the boundary between the upper Si pillar 3a and the bottom Si pillar 3.

In the first embodiment, the P⁺ layers 18 and 32 containing an acceptor impurity at a high concentration are formed on the side surface of the bottom portion of and on the top portion of the Si pillar 3. Alternatively, the P⁺ layers 18 and 32 may be replaced by N⁺ layers. Alternatively, a plurality of semiconductor pillars may be formed on a substrate, and may be individually provided with P⁺ layers 18 and 32 or N⁺ layers formed of different semiconductor base materials. Alternatively, the Si pillar 3 may be replaced by a pillar of another semiconductor material. The same applies to other embodiments according to the present invention.

In the first embodiment, the P⁺ layers 18 and 32 are both formed by a selective epitaxial crystal growth method so as to contain an acceptor impurity at a high concentration. This enables formation of PN junctions in which the acceptor impurity concentration sharply changes at the junction interfaces between the Si pillar 3 and the P⁺ layers 18 and 32. This leads to a decrease in the resistance of the source and drain of the SGT. Regarding such a decrease in the resistance of the source or drain, even in the case of forming one of the P⁺ layer 18 and the P⁺ layer 32 so as to contain an acceptor impurity at a high concentration by selective epitaxial crystal growth, this leads to a decrease in the resistance of the source or drain.

The first embodiment has been described with a case where the gate electrode is the TiN layer 12b. Alternatively, the gate electrode material layer may be another conductor layer constituted by a single layer or plural layers. The same applies to other embodiments according to the present invention.

The first embodiment has been described with an SGT in which the P⁺ layers 18 and 32, which are located on the top of and at the bottom of the Si pillar 3 and have a conductivity of the same polarity, constitute the source and the drain. Alternatively, the present invention is also applicable to a tunnel SGT having a source and a drain having different polarities. The same applies to other embodiments (except for the third embodiment) according to the present invention.

In the first embodiment, the P⁺ layer 18 is formed so as to be above and separated (in the perpendicular direction) from the upper end of the SiO₂ layer 5. This enables prevention of overlapping (in the perpendicular direction) of the SiO₂ layer 5 and the P⁺ layer 18. This enables prevention of an increase in the resistance of the source or drain caused by overlapping of the SiO₂ layer 5 and the P⁺ layer 18 and by the resultant decrease in the contact area between the P⁺ layer 18 and the Si surface of the side surface of the Si pillar 3. In addition, the side surface of the bottom portion of the Si pillar 3 on which the P⁺ layer 18 is grown by selective epitaxial crystal growth can be separated from the interface (where stress concentration occurs) between the Si pillar 3 and the SiO₂ layer 5. This enables formation of the P⁺ layer 18 of high crystallinity on the side surface of the bottom portion of the Si pillar 3 by selective epitaxial crystal growth. The same applies to other embodiments according to the present invention.

Figure 10A:
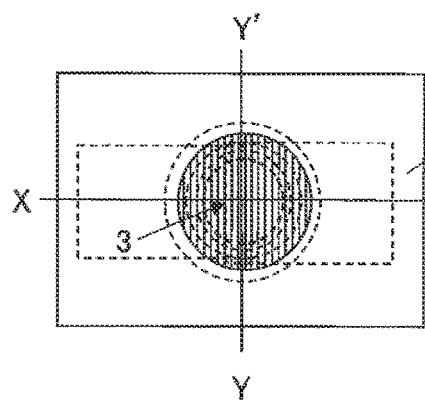
Figure 10C:
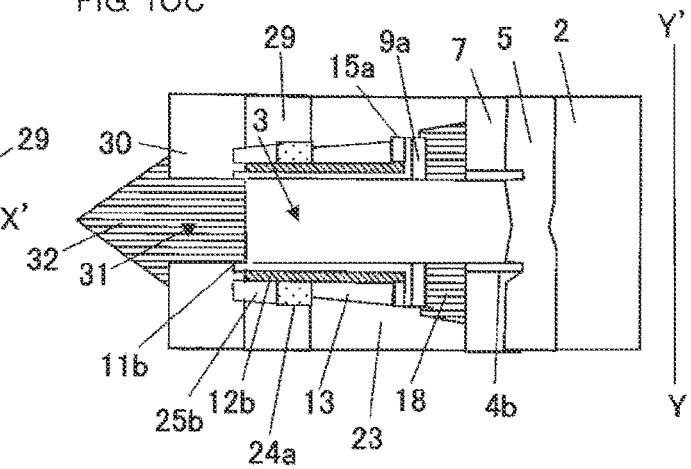
Figure 10B:
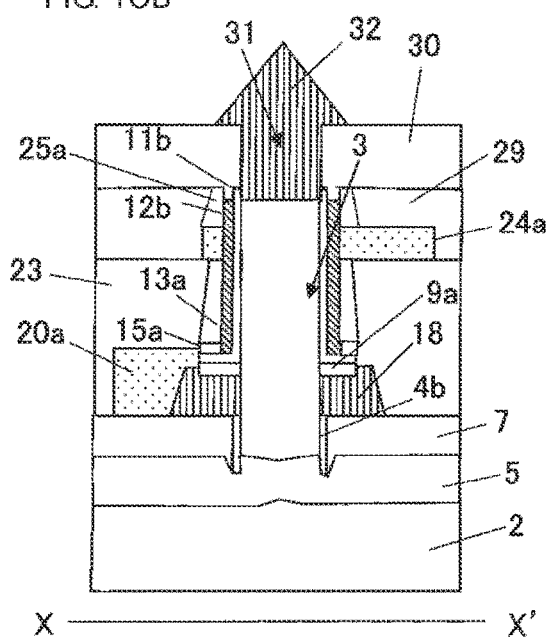

In the first embodiment, as has been described with FIG. 1NA to FIG. 10C, the top portion of the Si pillar 3 is etched to form the recessed portion 31, and subsequently the P⁺ layer 32 is formed in the recessed portion 31 by a selective epitaxial crystal growth method. For example, as illustrated in FIGS. 1MA to 1MC, the entire structure is covered with a SiN layer (not shown), and subsequently, the SiN layer is polished by a CMP method such that the level of the upper surface is lowered to the level of the upper surface of the mask material layer 1. Subsequently, the mask material layer 1 is etched to the Al₂O₃ layer. Alternatively, the mask material layer 1 may be entirely etched off, to thereby form, on the Si pillar 3, a recessed portion similar to the recessed portion 31. The same applies to other embodiments according to the present invention.

As described in the second embodiment, prior to formation of the W layer 36a, a barrier metal layer, for example, a Ta layer may be formed between the P⁺ layer 35 and the W layer 36a, in order to reduce the resistance between the P+ layer 35 and the W layer 36a. In this case, the Ta layer is formed, with a constant width in plan view, around the P+ layer 35. This Ta layer may be constituted by a single conductor layer or a plurality of conductor layers that have a constant width in plan view. The same applies to other embodiments according to the present invention.

In the third embodiment, after the mask material layer 1 is removed, the top portion of the Si pillar 3 is etched to form the recessed portion 42. This recessed portion 42 can be formed only by removing the mask material layer 1 as in the first embodiment. In this case, desirably, the top portion of the Si pillar 3 is slightly oxidized, and cleaning is subsequently performed to remove the resultant oxide film. The same applies to other embodiments according to the present invention.

In the third embodiment, the $SiO_2$ layer 38a in FIGS. 3EB and 3EC is not limited to a $SiO_2$ layer and may be another material layer as long as a Si layer does not deposit on the outer surface layer of the material layer during selective epitaxial crystal growth of the P+ layers 43 and 44. This material layer may be constituted by a single layer or plural layers. The same applies to other embodiments according to the present invention.

In the fourth embodiment, the P+ layer 50 is formed prior to formation of the gate $HfO_2$ layer 11d and the gate TiN layer 12d. The same applies to other embodiments according to the present invention.

In the fourth embodiment, as illustrated in FIGS. 4DA to 4DC, the exposed side surface of the Si pillar 3 is oxidized to form the $SiO_2$ layer 54. This $SiO_2$ layer 54 is removed to form a Si pillar 3a narrower than the Si pillar 3 in plan view. Alternatively, another method of, for example, etching the exposed Si layer in the surface of the Si pillar 3 may be used to form the Si pillar 3a. The same applies to other embodiments according to the present invention.

In the fourth embodiment, as illustrated in FIGS. 4DA to 4DC, the exposed side surface of the Si pillar 3 is oxidized to form the $SiO_2$ layer 54. This $SiO_2$ layer 54 is removed to form a Si pillar 3a narrower than the Si pillar 3 in plan view. This $SiO_2$ layer 54 surrounds the Si pillar 3a, in plan view, with a constant width. Since the oxidation rate varies depending on plane orientations, the $SiO_2$ layer 54 microscopically has irregularities due to the plane orientations of the side surface of the Si pillar 3. However, macroscopically, the $SiO_2$ layer 54 is formed with a constant width.

The above embodiments describe examples in which semiconductor regions of the semiconductor pillars such as channels, sources, and drains are formed of Si (silicon). However, this does not limit the present invention. The technical idea of the present invention is also applicable to SGT-including semiconductor devices that employ Si-containing semiconductor materials such as SiGe, or semiconductor materials other than Si.

The vertical NAND-type flash memory circuit includes plural memory cells stacked in the vertical direction, the memory cells each including a semiconductor pillar as the channel and including, around the semiconductor pillar, a tunnel oxide layer, a charge storage layer, an interlayer insulating layer, and a control conductor layer. Semiconductor pillars at both ends of these memory cells include a source line impurity layer corresponding to a source, and a bit line impurity layer corresponding to a drain. In addition, when one of memory cells on both sides of a memory cell functions as a source, the other functions as a drain. Thus, the vertical NAND-type flash memory circuit is one of SGT circuits. Therefore, the present invention is also applicable to NAND-type flash memory circuits.

The present invention encompasses various embodiments and various modifications without departing from the broad spirit and scope of the present invention. The above-described embodiments are provided for understanding of examples of the present invention and do not limit the scope of the present invention. Features of the above-described examples and modifications can be appropriately combined. The above-described embodiments from which some optional features have been eliminated depending on the need still fall within the technical idea of the present invention.

Pillar-shaped semiconductor devices according to the present invention provide high-performance pillar-shaped semiconductor devices.

What is claimed is:

1. A pillar-shaped semiconductor device comprising:
   a semiconductor pillar standing in a direction perpendicular to a substrate;
   a gate insulating layer surrounding the semiconductor pillar;
   a gate conductor layer surrounding the gate insulating layer;
   a first impurity region concentrically surrounding a lower side surface of the semiconductor pillar, the first impurity region containing an acceptor or donor impurity, and being constituted by a single layer or a plurality of layers;
   a second impurity region located on a top or an upper side surface of the semiconductor pillar and containing an acceptor or donor impurity; and
   a conductor layer formed partially around a circumferential surface of the first impurity region in contact with the first impurity region, separately from a wiring contact for electrically connecting to the first impurity region, wherein
   an upper surface of the first impurity region is located, in the perpendicular direction, around a level of a lower end of the gate insulating layer,
   a lower end of the second impurity region is located, in the perpendicular direction, around a level of an upper end of the gate insulating layer,
   the first impurity region and the second impurity region serve as a source and a drain, and
   the first impurity region and the second impurity region are monocrystalline.

2. The pillar-shaped semiconductor device according to claim 1, wherein the substrate comprises an oxide insulating layer formed below a bottom portion of the semiconductor pillar and a surface layer formed on the oxide insulating layer for connection with the bottom portion of the semiconductor pillar.

3. The pillar-shaped semiconductor device according to claim 2, wherein an upper surface of the oxide insulating layer and a lower end of the first impurity region are separated from each other in the perpendicular direction by the surface layer of the substrate.

4. The pillar-shaped semiconductor device according to claim 1, wherein the second impurity region includes:
   a third impurity region connected on the top of the semiconductor pillar, and extending upwardly in the perpendicular direction from the top of the semiconductor pillar, the third impurity region having horizontal cross-sections along its vertical length identical to a top surface of the semiconductor pillar; and
   a fourth impurity region connected to a top of the third impurity region, and having an outer peripheral edge horizontally extending, in plan view of the upper surface of the third impurity region, beyond an outer peripheral edge of the third impurity region.

5. The pillar-shaped semiconductor device according to claim 1, wherein the semiconductor pillar includes a first semiconductor pillar in contact with the first impurity region, and a second semiconductor pillar located above the first semiconductor pillar, and in plan view, an outer periphery of the first semiconductor pillar is located outside of an outer periphery of the second semiconductor pillar.

6. The pillar-shaped semiconductor device according to claim 5, further comprising a fifth impurity region disposed so as to be connected to, within the semiconductor pillar, the first impurity region, wherein, in the perpendicular direction, an upper end of the fifth impurity region is located at a level of an upper end of the first semiconductor pillar.

7. The pillar-shaped semiconductor device according to claim 1, further comprising, on or within the semiconductor pillar, an insulating layer having a lower end located, in the perpendicular direction, at a level of an upper end of the second impurity region.

8. The pillar-shaped semiconductor device according to claim 1, wherein, in the perpendicular direction, the second impurity region surrounds a side surface of the semiconductor pillar, and a top portion of the semiconductor pillar, the top portion being connected to the side surface.

* * * * *